US00RE45637E

(19) United States
(12) Reissued Patent
Vasoya

(10) Patent Number: US RE45,637 E
(45) Date of Reissued Patent: Jul. 28, 2015

(54) PROCESSES FOR MANUFACTURING PRINTED WIRING BOARDS

(75) Inventor: Kalu K. Vasoya, Yorba Linda, CA (US)

(73) Assignee: Stablcor Technology, Inc., Huntington Beach, CA (US)

(21) Appl. No.: 13/492,284

(22) Filed: Jun. 8, 2012
(Under 37 CFR 1.47)

Related U.S. Patent Documents

Reissue of:
(64) Patent No.: 7,730,613
Issued: Jun. 8, 2010
Appl. No.: 11/682,860
Filed: Mar. 6, 2007

U.S. Applications:
(63) Continuation-in-part of application No. 11/214,690, filed on Aug. 29, 2005, now Pat. No. 7,301,105.

(60) Provisional application No. 60/780,013, filed on Mar. 6, 2006.

(51) Int. Cl.
*H01K 3/10* (2006.01)
*H05K 3/38* (2006.01)
*H05K 3/40* (2006.01)

(52) U.S. Cl.
CPC ..... *H05K 3/386* (2013.01); *H05K 3/38* (2013.01); *H05K 3/403* (2013.01)

(58) Field of Classification Search
CPC ..... H05K 3/38; H05K 3/386; H05K 3/403
USPC ..... 29/825, 830, 840, 852; 174/255
See application file for complete search history.

(56) References Cited

U.S. PATENT DOCUMENTS 4,299,873 A 11/1981 Ogihara et al.
4,318,954 A 3/1982 Jensen
(Continued)

FOREIGN PATENT DOCUMENTS

CA 2014892 * 6/2002
CN 87107023 4/1988
(Continued)

OTHER PUBLICATIONS

International Search Report for International Application No. PCT/US2004/028246 filed Aug. 30, 2004, report completed Feb. 8, 2006, mailed Dec. 15, 2006, 3 pgs.
(Continued)

*Primary Examiner* — Carl Arbes
(74) *Attorney, Agent, or Firm* — KPPB LLP

(57) ABSTRACT

Methods of manufacturing printed wiring boards including electrically conductive constraining cores that involve a single lamination cycle are disclosed. One example of the method of the invention includes drilling a clearance pattern in an electrically conductive constraining core, arranging the electrically conductive constraining core in a stack up that includes B-stage (semi-cured) layers of dielectric material on either side of the constraining core and additional layers of material arranged to form the at least one functional layer, performing a lamination cycle on the stack up that causes the resin in the B-stage (semi-cured) layers of dielectric to reflow and fill the clearance pattern in the electrically conductive constraining core before curing and drilling plated through holes.

55 Claims, 26 Drawing Sheets

(56) References Cited

U.S. PATENT DOCUMENTS

| | | | | |
|---|---|---|---|---|
| 4,568,971 | A | 2/1986 | Alzmann et al. | |
| 4,591,659 | A | 5/1986 | Leibowitz | |
| 4,604,319 | A | 8/1986 | Evans et al. | |
| 4,609,586 | A | 9/1986 | Jensen et al. | |
| 4,664,768 | A | 5/1987 | Scala et al. | |
| 4,680,079 | A | 7/1987 | Tanaka | |
| 4,689,110 | A | 8/1987 | Leibowitz | |
| 4,711,804 | A | 12/1987 | Burgess | |
| 4,747,897 | A | 5/1988 | Johnson | |
| 4,769,270 | A | 9/1988 | Nagamatsu et al. | |
| 4,792,646 | A | 12/1988 | Enomoto | |
| 4,812,792 | A | 3/1989 | Leibowitz | |
| 4,878,152 | A | 10/1989 | Sauzade et al. | |
| 4,888,247 | A | 12/1989 | Zweben et al. | |
| 5,004,639 | A | 4/1991 | Desai | |
| 5,250,363 | A | 10/1993 | Chen | |
| 5,304,743 | A | 4/1994 | Sen et al. | |
| 5,326,636 | A | 7/1994 | Durand et al. | |
| 5,354,599 | A | 10/1994 | McClanahan et al. | |
| 5,382,505 | A | 1/1995 | Schmidt et al. | |
| 5,436,062 | A | 7/1995 | Schmidt et al. | |
| 5,509,200 | A | 4/1996 | Frankeny | |
| 5,527,838 | A | 6/1996 | Afzali-Ardakani et al. | |
| 5,533,841 | A | 7/1996 | Iwano et al. | |
| 5,646,373 | A | 7/1997 | Collins et al. | |
| 5,746,929 | A | 5/1998 | Schmidt et al. | |
| 5,819,401 | A | 10/1998 | Johannes et al. | |
| 5,824,177 | A | 10/1998 | Yoshihara et al. | |
| 5,861,666 | A | 1/1999 | Bellaar | |
| 6,013,588 | A * | 1/2000 | Ozaki | 442/179 |
| 6,016,598 | A | 1/2000 | Middelman et al. | |
| 6,054,337 | A | 4/2000 | Solberg | |
| 6,068,782 | A | 5/2000 | Brandt et al. | |
| 6,147,401 | A | 11/2000 | Solberg | |
| 6,207,904 | B1 | 3/2001 | Kramer et al. | |
| 6,211,487 | B1 | 4/2001 | Hatakeyama et al. | |
| 6,214,640 | B1 | 4/2001 | Fosberry et al. | |
| 6,222,740 | B1 | 4/2001 | Bovensiepen et al. | |
| 6,225,688 | B1 | 5/2001 | Kim et al. | |
| 6,232,152 | B1 | 5/2001 | DiStefano et al. | |
| 6,313,528 | B1 | 11/2001 | Solberg | |
| 6,329,603 | B1 | 12/2001 | Japp et al. | 174/255 |
| 6,340,796 | B1 | 1/2002 | Smith et al. | 174/255 |
| 6,341,067 | B1 | 1/2002 | Conder | |
| 6,373,000 | B2 | 4/2002 | Nakamura et al. | 174/264 |
| 6,400,010 | B1 | 6/2002 | Murata | |
| 6,400,576 | B1 | 6/2002 | Davidson | |
| 6,426,470 | B1 * | 7/2002 | Farquhar et al. | 174/266 |
| 6,448,509 | B1 * | 9/2002 | Huemoeller | 174/262 |
| 6,459,047 | B1 | 10/2002 | Japp et al. | 174/256 |
| 6,479,136 | B1 | 11/2002 | Nakanishi | |
| 6,486,394 | B1 | 11/2002 | Schmidt et al. | |
| 6,541,865 | B2 | 4/2003 | Hawker et al. | |
| 6,597,583 | B1 | 7/2003 | Sasaki | |
| 6,613,313 | B2 | 9/2003 | Kimura | |
| 6,613,413 | B1 | 9/2003 | Japp et al. | 428/131 |
| 6,639,155 | B1 | 10/2003 | Bupp et al. | |
| 6,700,078 | B2 * | 3/2004 | Farquhar et al. | 174/262 |
| 6,711,812 | B1 | 3/2004 | Lu et al. | |
| 6,722,031 | B2 | 4/2004 | Japp et al. | 29/852 |
| 6,766,576 | B2 | 7/2004 | Haze et al. | |
| 6,794,748 | B1 | 9/2004 | Chiu | |
| 6,820,332 | B2 | 11/2004 | Japp et al. | |
| 6,844,504 | B2 | 1/2005 | Wang et al. | |
| 6,869,664 | B2 | 3/2005 | Vasoya et al. | 428/209 |
| 6,869,665 | B2 * | 3/2005 | Tani et al. | 428/209 |
| 6,920,624 | B2 | 7/2005 | Garrepally et al. | |
| 6,938,227 | B2 | 8/2005 | Murphy et al. | |
| 6,996,903 | B2 * | 2/2006 | Farquhar et al. | 29/852 |
| 7,002,080 | B2 | 2/2006 | Tani et al. | 174/258 |
| 7,038,142 | B2 * | 5/2006 | Abe | 174/255 |
| 7,047,628 | B2 | 5/2006 | Lee | |
| 7,301,105 | B2 * | 11/2007 | Vasoya | 174/255 |
| 7,378,602 | B2 | 5/2008 | Ikeda | |
| 7,388,157 | B2 * | 6/2008 | Abe et al. | 174/256 |
| 7,635,815 | B2 | 12/2009 | Vasoya et al. | |
| 7,667,142 | B2 | 2/2010 | Vasoya et al. | |
| 8,097,335 | B2 | 1/2012 | Vasoya et al. | |
| 8,203,080 | B2 | 6/2012 | Vasoya | |
| 2001/0010250 | A1 | 8/2001 | Kobayashi et al. | |
| 2002/0085360 | A1 | 7/2002 | Doi | |
| 2002/0157859 | A1 * | 10/2002 | Vasoya et al. | 174/250 |
| 2003/0029850 | A1 | 2/2003 | Varriano-Marston | |
| 2003/0136577 | A1 | 7/2003 | Abe | |
| 2003/0196749 | A1 | 10/2003 | Japp et al. | 156/250 |
| 2004/0099364 | A1 | 5/2004 | Suzuki et al. | |
| 2004/0107569 | A1 | 6/2004 | Guzek et al. | |
| 2004/0118602 | A1 | 6/2004 | Lee et al. | 174/260 |
| 2004/0130877 | A1 | 7/2004 | Okubora | |
| 2004/0151882 | A1 | 8/2004 | Tani et al. | |
| 2004/0163248 | A1 | 8/2004 | Lu et al. | |
| 2004/0165361 | A1 | 8/2004 | Kimura et al. | |
| 2004/0262036 | A1 | 12/2004 | Brist et al. | |
| 2005/0016763 | A1 | 1/2005 | Zollo et al. | 174/256 |
| 2005/0257957 | A1 * | 11/2005 | Vasoya | 174/260 |
| 2006/0231198 | A1 * | 10/2006 | Vasoya | 156/256 |
| 2010/0319969 | A1 | 12/2010 | Vasoya et al. | |
| 2012/0097431 | A1 | 4/2012 | Vasoya et al. | |
| 2012/0241202 | A1 | 9/2012 | Vasoya | |

FOREIGN PATENT DOCUMENTS

| | | | |
|---|---|---|---|
| CN | 1269538 | A | 10/2000 |
| EP | 0313961 | A1 | 5/1989 |
| EP | 1821586 | A1 | 8/2007 |
| GB | 2248725 | | 4/1992 |
| JP | 5-45079 | | 8/1987 |
| JP | 62181128 | | 8/1987 |
| JP | 63311796 | | 12/1988 |
| JP | 4024998 | | 1/1992 |
| JP | 07001828 | B2 | 1/1995 |
| JP | 7249847 | | 9/1995 |
| JP | 8083981 | | 3/1996 |
| JP | 11040902 | | 2/1999 |
| JP | 1140902 | A | 5/1999 |
| JP | 11163538 | A | 6/1999 |
| JP | 2000323840 | | 11/2000 |
| JP | 2003243831 | | 8/2003 |
| JP | 2003273482 | A | 9/2003 |
| JP | 2004355203 | | 12/2004 |
| WO | 9502505 | A1 | 1/1995 |
| WO | 9717199 | A1 | 5/1997 |
| WO | 02/47899 | A1 * | 6/2002 |
| WO | 2005117508 | A2 | 12/2005 |
| WO | 2005117508 | A3 | 12/2005 |
| WO | 2006026566 | A1 | 3/2006 |
| WO | 2006099554 | A2 | 9/2006 |
| WO | 2007103949 | A2 | 9/2007 |
| WO | 2007103949 | A3 | 6/2008 |
| WO | 2006099554 | A3 | 4/2009 |

OTHER PUBLICATIONS

International Search Report for International Application PCT/US2007/016210, Report completed Jun. 3, 2008, mailed Oct. 15, 2008, 4 pgs.

Supplemental European Search Report dated Feb. 11, 2010 from corresponding European Application No. EP 05 76 3696, 3 pages.

Written Opinion for International Application No. PCT/US2004/028246 filed Aug. 30, 2004, report completed Aug. 23, 2006, mailed Dec. 15, 2006, 3 pgs.

Written Opinion for International Application PCT/US2007/016210, Opinion completed Jun. 3, 2008, mailed Oct. 15, 2008.

Rellick, Gerald, Carbon and Graphite Matrices in Carbon-Carbon Composites: An Overview of Their Formation, Structure, and Properties, Oct. 1992, Retrieved from: https://web.anl.gov/PCS/acsfuel/preprint%20archive/Files/36_3_NEW%20YORK_08-91_1094.pdf, 16 pgs.

Written Opinion for international Application No. PCT/US2005/030709, filed Aug. 29, 2005, 3 pgs.

CTE Matched MLB, Dyconex—Technologies & Products—Products—CTE Matched MLB, Oct. 4, 1997, printout from dyconex.com website, 3 pages.

(56) References Cited

OTHER PUBLICATIONS

High-Performance DYCOstrate® MLBs , Dyconex Advanced Circuit Technology, pp. 1-11, (1999).
"Thermal Management of Electronics", The 5th International Bureau and Technology Summit, Aug. 17-18, 2005, Natick, MA, Show brochure and documents, 465 pages.
International Search Report dated Jan. 11, 2006, mailed Jan. 19, 2006 for International Application No. PCT/US2005/030709, filed Aug. 29, 2005, 2 pgs.
International Search Report for International Application No. PCT/US2005/017150, International Filing Date May 16, 2005, Search completed Jan. 10, 2007, mailed Mar. 5, 2007, 4 pgs.
Written Opinion dated Jan. 11, 2006 mailed Jan. 19, 2006 for Application No. PCT/US2005/030709 filed Aug. 29, 2005, 3 pgs.
Written Opinion for International Application No. PCT/US2005/017150, International filing Date May 16, 2005, Opinion completed Jan. 10, 2007, mailed Mar. 5, 2007, 6 pgs.
Dietz, "Fine Lines in High Yield (Part LXXX): Problems with Residual, Excess Copper in Print/Etch and Tent/Etch Processes (Part C)", Tech Talk, printout from Circuitree website by BNP Media, 5 pages, May 1, 2002.
Meier et al., "Lasering Structuring of Fine Lines", posted Sep. 1, 2000, 7 pgs.
Spitz, S L. "Specialty Laminates Fill Special Needs", Electronic Packaging and Production, Cahners Publishing Co, Newton, MA, US, vol. 29, No. 2, Feb. 1, 1989, pp. 108-111.
International Search Report for International Application PCT/US2007/063429, filed Mar. 6, 2007; report completed Sep. 3, 2007; mailed Mar. 14, 2008; 2 pgs.
Written Opinion for International Application PCT/US2007/063429 filed Mar. 6, 2007; report completed Sep. 3, 2007; mailed Mar. 14, 2008; 5 pgs.
International Search Report for International Application No. PCT/US06/09597, Report completed Jan. 8, 2008, Report mailed May 21, 2008, 4 pages.
Written Opinion of the International Searching Authority for International Application No. PCT/US06/09597, Opinion completed Jan. 8, 2008, Opinion mailed May 21, 2008, 7 pgs.

* cited by examiner

340

| Hole Pitch--> | 1mil | 5mil | 10mil | 12mil | 15mil | 20mil |
|---|---|---|---|---|---|---|
| Drill Size (mil) | ↓ NOTCH SIZE ↓ | | | | | |
| 25 | 0.1mil | 0.25mil | 1.6mil | 1.8mil | 2.5mil | 5.1mil |
| 25.8 | 0.1mil | 0.25mil | 1.1mil | 1.5mil | 2.4mil | 4.9mil |
| 26 | 0.1mil | 0.25mil | 1.1mil | 1.5mil | 2.4mil | 4.7mil |
| 27.6 | 0.1mil | 0.25mil | 1.0mil | 1.4mil | 2.3mil | 4.3mil |
| 28 | 0.1mil | 0.25mil | 0.9mil | 1.4mil | 2.2mil | 4.3mil |
| 29.2 | 0.1mil | 0.2mil | 0.9mil | 1.3mil | 2.1mil | 4.0mil |
| 31 | 0.1mil | 0.2mil | 0.8mil | 1.2mil | 2.0mil | 3.7mil |
| 31.2 | 0.1mil | 0.2mil | 0.8mil | 1.2mil | 2.0mil | 3.7mil |
| 31.5 | 0.1mil | 0.2mil | 0.8mil | 1.2mil | 1.9mil | 3.6mil |
| 32 | 0.1mil | 0.2mil | 0.8mil | 1.2mil | 1.9mil | 3.6mil |
| 33 | 0.1mil | 0.2mil | 0.8mil | 1.1mil | 1.9mil | 3.4mil |
| 33.5 | 0.1mil | 0.2mil | 0.7mil | 1.1mil | 1.8mil | 3.4mil |
| 35 | 0.1mil | 0.2mil | 0.7mil | 1.1mil | 1.7mil | 3.2mil |

1mil = 0.001inch

PROCESSES FOR MANUFACTURING PRINTED WIRING BOARDS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application is a continuation-in-part of U.S. patent Ser. No. 11/214,690 to Vasoya filed Aug. 29, 2005 now U.S. Pat. No. 7,301,105 and claims the benefit of U.S. Provisional Patent Application Ser. No. 60/750,013 to Vasoya filed Mar. 6, 2006. The disclosure of U.S. patent application Ser. No. 11/214,690 to Vasoya and U.S. Provisional Patent Application Ser. No. 60/780,013 to Vasoya is hereby incorporated herein by reference in its entirety.

BACKGROUND

The present invention generally relates to the manufacture of printed wiring boards and more specifically to the filling of clearance patterns in conductive constraining core layers used in the construction of multilayer printed wiring board (PWB).

Computers and similar electronics products are pervasive in consumer, businesses, military, aerospace and governmental activities. The use of electronics in critical applications has created an increased demand for reliable electronics. Many applications specify electronics that will run longer with less down time than was expected in the past.

The increased emphasis on reliability amongst customers also extends to PWBs. PWBs can be used to establish electrical connections between devices. In some instances, the devices can be mounted on the printed wiring board. The manner in which the devices are mounted is typically dependent upon the packaging of the device. Applications for printed wiring boards can include challenges such as thermal management, expansion mismatch control, low stiffness or rigidity and higher weight. Materials that have been used in the past to address some of these issues include thick metal core, copper-Invar-copper (CIC), copper-Moly-copper (CMC). These metal core materials are electrically conductive and require special processing in order to be incorporated into printed wiring board structures. These special processes can include drilling clearance patterns, surface preparation, clearing pattern filling and additional lamination steps. Use of these materials and the associated additional processes are typically associated with a substantially lower manufacturing yield and additional labor cost. In addition, drilling small via holes or plated through holes (PTH) through thick metal cores can be problematic. An inability to drill small via holes through a material can limit the usefulness of the material in the construction of high density interconnects.

A variety of other materials can be used in place of the metal materials above to try and address reliability issues such as thermal management, expansion mismatch control, low stiffness or rigidity and higher weight. U.S. Pat. No. 6,869,664 to Vasoya et al., U.S. patent application Ser. No. 11/131,130 to Vasoya, U.S. patent application Ser. No. 11/376,806 to Vasoya and U.S. Provisional Patent Application Ser. No. 60/831,108 to Vasoya disclose techniques that can be used to manufacture printed wiring boards having a desired coefficient of thermal expansion (CTE) using layers incorporating carbon materials such as woven carbon fiber. The disclosure of U.S. Pat. No. 6,869,664 to Vasoya et al., U.S. patent application Ser. No. 11/131,130 to Vasoya, U.S. patent application Ser. No. 11/376,506 to Vasoya and U.S. Provisional Patent Application Ser. No 60/831,108 to Vasoya is incorporated herein by reference in its entirety.

SUMMARY OF THE INVENTION

Printed wiring boards and manufacturing techniques for drilling and filling clearance patterns in an electrically conductive constraining core are described. An aspect of several embodiments of the invention is the incorporation of conductive constraining core layers into PWBs using existing processes for manufacturing PWBs that do not include conductive constraining cores. A further aspect of the invention is the creation of a PWB that includes electrically conductive constraining cores using a single lamination cycle. An additional aspect of the invention is the creation of a PWB that includes electrically conductive constraining cores where a separate lamination cycle is not required to fill a clearance pattern in a constraining core prior to the constraining core being combined with other layers in the PWB.

One embodiment of the method of the invention includes drilling a clearance pattern in an electrically conductive constraining core, arranging the electrically conductive constraining core in a stack up that includes B-stage (semi-cured) layers of dielectric material on either side of the constraining core and additional layers of material arranged to form the at least one functional layer, performing a lamination cycle on the stack up that causes the resin in the B-stage (semi-cured) layers of dielectric to reflow and fill the clearance pattern in the electrically conductive constraining core before curing and drilling plated through holes.

A further embodiment includes extracting from a printed wiring board design information concerning the locations of plated through holes that are not intended to be in electrical contact with the electrically conductive constraining core and determining the clearance pattern using the information concerning the locations of plated through holes that are not intended to be in electrical contact with the electrically conductive constraining core.

In another embodiment, the electrically conductive constraining core has two major surfaces and can conduct electricity directly from one major surface to the other.

In a still further embodiment, the electrically conductive constraining core has a dielectric constant greater than 6 at 1 MHz.

In still another embodiment, the electrically conductive constraining core is constructed using fibrous material impregnated with resin.

In a yet further embodiment, the fibrous material is carbon fiber.

In a further embodiment again, the carbon fiber is metallized.

In yet another embodiment, the electrically conductive constraining core is constructed from a thick metal layer.

Another additional embodiment also includes screening resin into the clearance pattern in the electrically conductive constraining core prior to lamination.

A still yet further embodiment also includes stacking a plurality of electrically conductive constraining cores, drilling the clearance pattern in the stack of electrically conductive constraining cores and creating lamination tooling holes in the electrically conductive constraining core.

Still yet another embodiment also includes printing and etching the electrically conductive constraining cores to remove debris prior to lamination.

In a still further embodiment again, the B-stage (semi-cured) layers of dielectric are prepregs and the stack up includes layers of electrically conductive material.

In still another embodiment again, the B-stage (semi-cured) layers of dielectric include at least 70% by volume resin content.

In a still further additional embodiment, regions of the electrically conductive constraining core are constructed using a base substrate material and at least one region of the electrically conductive constraining core is constructed using an insert substrate material.

Still another additional embodiment, also includes selecting a base substrate material, removing a section of the base substrate material, selecting an insert substrate material, cutting a piece of the insert substrate material that can be contained within the removed section of the base substrate material and arranging the base substrate material and the piece of the insert substrate material as part of the stack up.

In a yet further embodiment again, drilling a clearance pattern also includes determining the location and required width of a clearance channel from a printed wiring board design, determining the distance between notches that are likely to be created when a selected drill bit and drill pitch are used to drill the channel, and selecting a drill bit and drilling pitch so that the distance between the notches is greater than the required width for the channel.

Yet another embodiment again also includes identifying a plated through hole that creates an electrical connection with the electrically conductive constraining core, which is closest to the clearance channel, using the printed wiring board design, determining the distance between the clearance channel and the identified plated through hole, and selecting the drill bit and drilling pitch so that the resulting channel does not overlap the location of the identified plated through hole.

A another further embodiment also includes determining the height of the notches and selecting a drill bit and drilling pitch so that the height of the notches is less than 3 mil.

Still another further embodiment also includes selecting a drill bit and drilling pitch so that the height of the notches is less than 1 mil.

DETAILED DESCRIPTION OF THE INVENTION

Turning now to the drawings, processes for manufacturing printed wiring boards including electrically conductive constraining cores are shown. In many embodiments, printed wiring boards are constructed using a single lamination cycle. In a number of embodiments, processes are performed on electrically conductive constraining cores and other materials used in the construction of the printed wiring board to create a stack up that is formed into a printed wiring board using a single lamination cycle. In other embodiments, a printed wiring board is created without the need for a separate lamination cycle to fill clearance holes drilled in the electrically conductive constraining core prior to that core being combined with other functional layers of the printed wiring board. Use of a single lamination cycle and/or the elimination of a lamination cycle can significantly increase yield and throughput compared to manufacturing processes that use multiple lamination cycles. In several embodiments, the electrically conductive constraining cores include carbon materials. In other embodiments, the electrically conductive constraining cores are thick metal cores. In numerous embodiments, the conductive constraining cores include localized regions having different physical properties, such as CTE.

Figure 1:
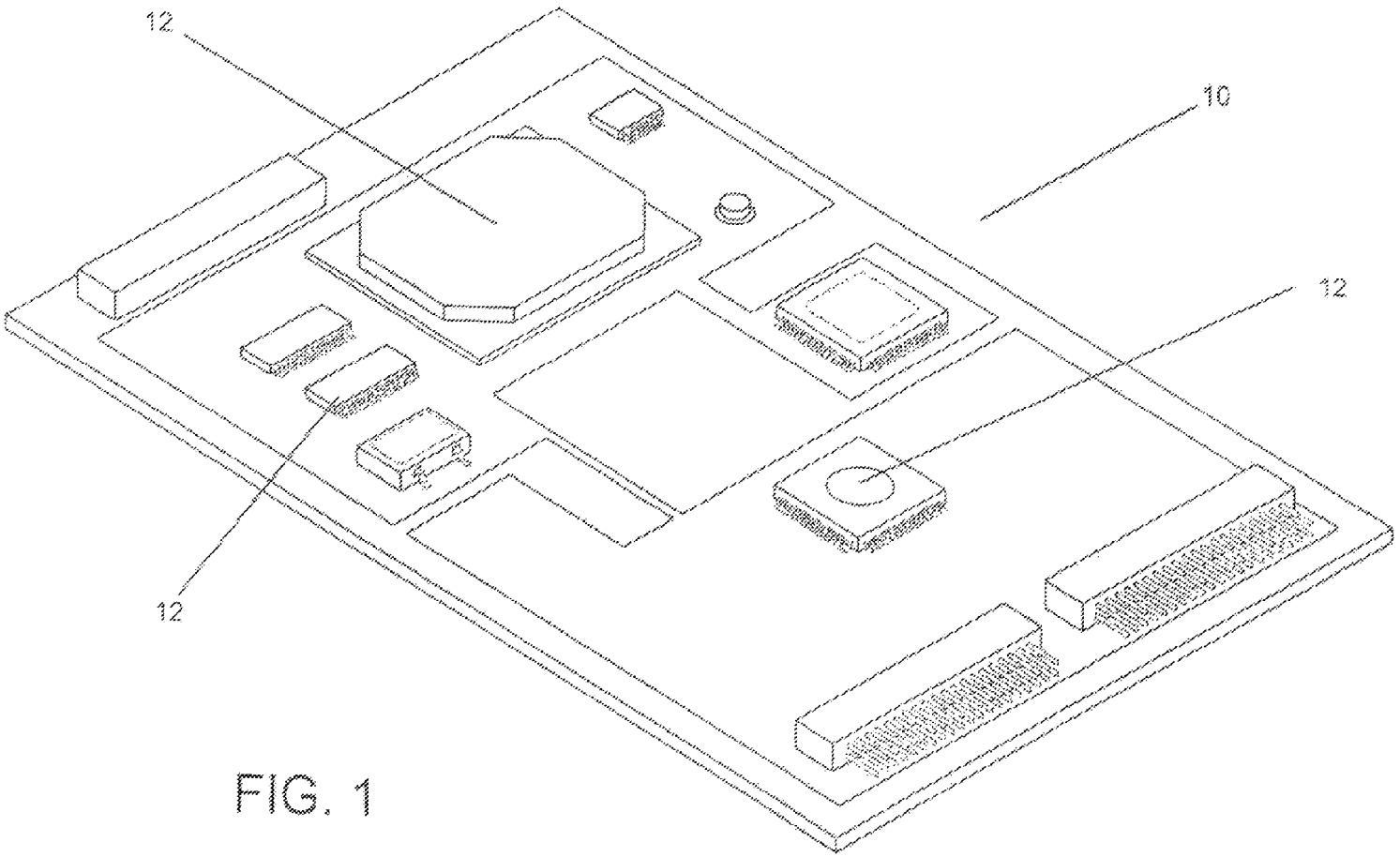
FIG. 1 is an isotropic view of a printed wiring board in accordance with an embodiment of the invention on which a number of electronic devices possessing different types of packaging are mounted.

An embodiment of a printed wiring board (PWB) in accordance with the present invention is illustrated in FIG. 1. The PWB 10 includes a number of electronic devices 12 that are contained within different types of packaging. The printed wiring board includes regions possessing different CTEs. The location of the electronic devices on the printed wiring board is determined so that each electronic device is positioned above a region of the printed wiring board that has a CTE compatible with the CTE of the electronic device. Typically, the CTE of interest is the in-plane CTE of both the device packaging and the printed wiring board. The compatibility of the CTE of the packaging of an electronic device and the CTE of the region of the printed wiring board is largely dependent upon the operating requirements of the particular application in which the printed wiring board is intended for use.

Figure 2:
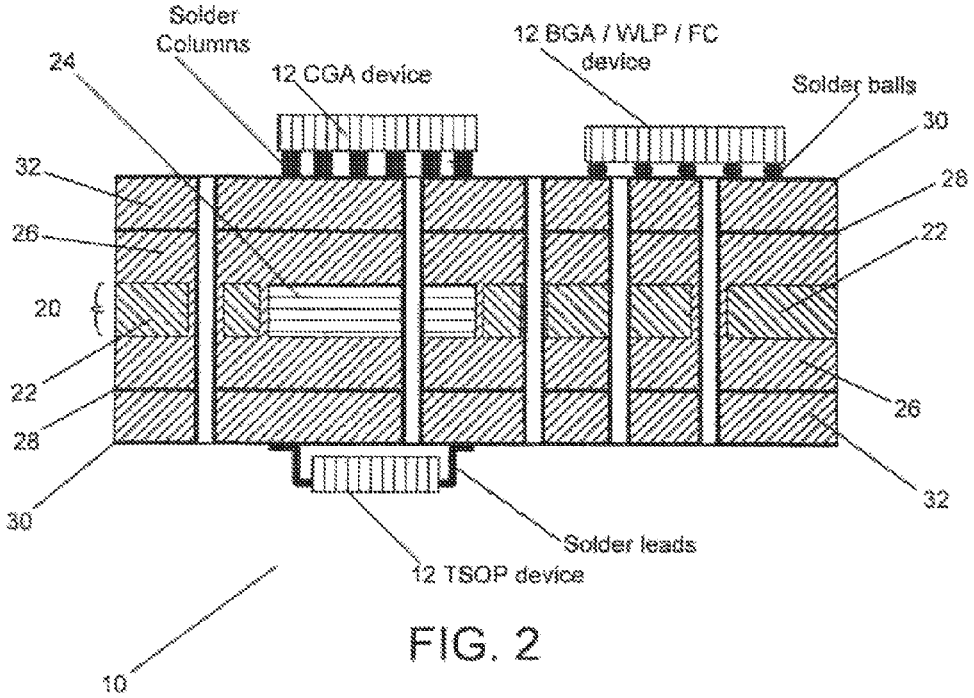
FIG. 2 is a schematic cross-sectional view of the printed wiring board shown in FIG. 1.

A cross section of the PWB 10 shown in FIG. 1 is illustrated in FIG. 2. The PWB 10 includes a number of functional and structural layers constructed from various materials. The functional layers of the PWB are the layers that are intended to establish electrical connections between electronic devices and/or contain circuits that carry signals including reference voltages such as power or ground voltages. The structural layers of the PWB are the layers that are not intended to establish connections between electronic devices and/or contain circuit traces carrying signals. The structural layers are included for their physical properties.

The PWB 10 shown in FIG. 2 includes an electrically conductive constraining core 20 that can act as a structural layer, as a functional layer or as a structural layer in portions and a functional layer in other portions. Throughout the specification electrically conductive constraining core layers are referred to as constraining cores. The constraining core 20 includes regions that are constructed from different materials. The illustrated embodiment includes regions 22 that are constructed from a base material and at least one region 24 that is constructed from an insert material. In instances where there are multiple regions 24 constructed from insert materials, each of the insert materials can possess different physical properties. Selection of the base and insert materials enables customization of the physical properties of the constraining core 20. In many embodiments, a resin 26 or an equivalent thermosetting or thermoplastic material such as an adhesive is used to combine the regions into a single layer. The resin can provide structural support for the various regions of materials. In many embodiments, the resin also electrically insulates the constraining core 20 from adjacent layers of electrically conductive material 28. The remainder of the PWB includes layers of electrically conductive material 30 that can form functional layers of the PWB and that are separated from each other by layers of dielectric material 32.

As will be discussed further below, the techniques described herein can be used to combine almost any two types of material that can be used in the construction of a PWB. The techniques described vary depending upon whether the base materials and insert materials are dielectric materials (i.e., effectively impede the flow of the type of electric signals found in a PWB) or are non-dielectric materials (i.e., electrically conductive) and whether the resin 26 is dielectric or non-dielectric. The choice of base and insert materials can impact the physical properties of the PWB. In instances where the insert materials 24 that form part of the constraining core 20 are constructed from materials having different sets of physical properties to those of the base material 22, the completed PWB can possess regions with different physical properties. In many instances, the insert materials 24 are selected to provide regions of the PWB with specific in-plane CTEs compatible with the in-plane CTEs of devices mounted on the PWB.

In the embodiment illustrated in FIG. 2, the base material 22 is constructed from a non-dielectric material such as carbon fiber impregnated with a resin such as EP 387 and EP450 manufactured by Lewcott Corporation of Millbury, Mass., the insert material 24 is constructed from a dielectric material such as E-glass impregnated with resin and the resin 26 combining the base and insert materials is a dielectric resin.

The carbon fiber used as the base material in the embodiment shown in FIG. 2 is an example of a non-dielectric material suitable for use in the construction of PWBs. Other examples of suitable non-dielectric materials include fibers coated in metal and impregnated with resin, solid carbon plates, Carbon-Silicon Carbide (C SiC), such as the C—SiC manufactured by Starfire Systems Inc. of Malta, N.Y., Copper Invar Copper, Copper Molly Copper, Chemical Vapor Deposition (CVD) diamond, such as the CVD manufactured by Morgan Advanced Ceramics, Diamonex Products Division located at Allentown, Pa., Diamond, Diamond Like Carbon (DLC), Carbon composite and Graphite composite or a metal matrix composite. Each of these materials can be clad on at least one side.

When a non-dielectric material includes carbon fibers, the fibers can be continuous, discontinuous, chopped or flakes. If discontinuous fibers are used, the fibers can be spin broken or stretch broken such as part no. X0219 manufactured by Toho Carbon Fibers Inc of Rockwood, Tenn. In addition, the carbon fiber can include PAN fibers and/or Pitch fibers.

Fibers that are suited to metal coating include carbon, graphite, Aramid, Kevlar, Quartz or any combinations of these fibers. Metals that can be used to coat fibers include Nickel, Copper, Palladium, Silver, Tin and Gold. Coating of fibrous material can be performed by manufacturers such as Electro Fiber Technologies located at Stratford, Conn.

The configurations in which fibrous materials can be arranged include being woven, unidirectional or non-woven mats. When the material is woven, the material can be in the form of a plain weave, twill weave, 2×2 twill, basket weave, leno weave, satin weave, stitched uni weave or 3D (three dimensional) weave.

Fibrous materials can also be used in a non-woven form such as a Uni-tape or a mat. In many embodiments, carbon mats such as grade number 8000040 2 oz mat or 8000047 3 oz mat manufactured by Advanced Fiber Non Wovens, East Walpole, Mass. are used in the construction of the region 22 constructed from a first material.

Carbon plates can be made using compressed carbon powder, carbon flakes or chopped carbon fiber.

A constraining core can also be constructed from a composite including carbon nanotubes impregnated with polymer. Carbon nanotubes can be single walled carbon nanotubes, such as carbon single walled nanotubes (C-SWNT) manufactured by Raymor Industries Inc. Canada, carbon nanotubes developed by National Institute of Advanced Industrial Science and/or Technology (AIST) in Tsukuba, Japan. Single walled carbon nanotubes are unique forms of pure carbon, which are up to 100 times stronger than steel at $1/6^{th}$ the weight. C-SWNT has impressive electrical properties, as it can conduct electricity up to 1,000 times faster than copper. Current density of carbon nanotubes is $10^9$ A/cm$^3$ (1000× greater than copper). C-SWNT can transfer heat up to 10 times greater than that of copper. Carbon nanotubes can be manufactured employing a Plasma Process, Chemical Vapor Deposition (CVD) chemical process, a Gas Phase CVD process, Arc Discharge process or a Laser Ablation process. Carbon nanotubes can be less than 1 nm to 100 nm in diameter and <2000 nm in length.

In instances where the non-dielectric material includes a resin (e.g., when it is a resin impregnated substrate), the resin can be Epoxy, Phenolic, Bismaleimide Triazine Epoxy (BT), Cynate Ester and/or a Polyimide based Bismaleimide (BMI), Phenolic, polyamide imide, polyacrylate, polyphenylene sulfide, tetrafluroethylene, polysulfone, polyphenylsulfone, polyethersulfone, polyphthalamide, polyacetal, polyketone, polycarbonate, polyphenylene oxide, polyether ether ketone based or a combination of resins. The basic resin can also include fillers such as pyrolytic carbon powder, carbon nanoparticles, carbon nanotubes (diameters ranging from <1-100 nm), carbon single walled nanotubes (C-SWNT), carbon powder, carbon particles, diamond powder, boron nitride, alumina, aluminum oxide, aluminum nitride, aluminum hydroxide, magnesium hydroxide, silica powder and ceramic particles to modify the physical, mechanical, electrical and thermal properties of the base resin. The resin composite may contain between 2 and 80 percent by weight of such filler. In several embodiments, the filler particle size is limited to be no greater than 25 um.

As discussed above, the insert material 24 shown in FIG. 2 is constructed from a dielectric material. Examples of other dielectric materials that can be used in the construction of a PWB include Aramid, Kevlar, or any mixture of these fibrous materials.

In embodiments where the regions 24 constructed from a second material include resin, the resin can be an Epoxy based resin, an Bismaleimide Triazine Epoxy based resin, a Cynate Ester based resin and/or a Polyimide based resin. The resin system can also include fillers that modify the properties of the base resin.

In one embodiment, the resin 26 surrounding the regions 24 and 22 is constructed from thin E-glass, such as 106 style reinforced E-glass, that has a high resin content, high crack resistance and high toughness. In many embodiments, the resin can be Bismaleimide Triazine Epoxy based, an Epoxy Cynate Ester blend, Cynate Ester based, Polyimide based and/or PTFE based. The resin 26 can also include one or more additives that alter the base resin's physical properties. In many embodiments, the resin is capable of withstanding the forces associated with the thermal cycling of the various materials in the layer 20, which can have different CTEs. Suitable materials include 44N106, 84N106 B-stage materials manufactured by ARLON Electronic Material Division located at Rancho Cucamonga Calif., USA. Also 370HR106, 370 106 epoxy as well as PCL-GIP-785 polyimide 106 B-staged material manufactured by PolyClad Laminates located at Franklin N.H., USA. Also Laser Preg G130 and 1080 manufactured by ISOLA Laminates located at Chandler, Ariz. Other prepreg styles such as 1080, 2113, 2313, 2116, 7628 can also be used.

Many embodiments of PWBs in accordance with the present invention include a constraining core 20 constructed using at least one or a combination of the dielectric and non-dielectric materials described above. The lists provided above are not exhaustive. The region 22 constructed from a base material and the regions 24 constructed from insert materials can be fabricated from virtually any material that can be used alone or in combination with other materials to create a laminate suitable for use in a PWB. As discussed above, the choice of materials is typically influenced by the physical properties of the materials, including the resulting in-plane CTE of the region of the PWB incorporating the material.

In one embodiment, the layers of electrically conductive material 28 and 30 can be constructed from Copper foils, manufactured by GOULD Electronics located at Eastlake, Ohio. Alternatively, the conductive material can be constructed from a resistive conductive foil such as the resistor-conductor materials manufactured by Ohmega Tehcnologies, Inc. of Culver City, Calif. In other embodiments layers of electrically conductive material can be constructed by depositing copper by a chemical process such as the process used in depositing copper in plated through holes, resin coated copper (RCC), Nickel coated copper foil, Nickel-Gold coated copper foil and any other material that can be used in construction of the PWB. In addition, the layers of electrically conductive material can be layers similar to the constraining core 20 provided at least part of the constraining core 20 acts as a functional layer.

In one embodiment, the dielectric layers 32 are constructed using E-glass reinforced with resin. In other embodiments, the dielectric layers can be constructed from an epoxy based material, Cynate Ester based material, Polyimide based material, GTek material, PTFE based material, an Aramid based material, chopped Kevlar based material, Kevlar based material, Quartz based material and any other material that can be used in construction of a dielectric layer in a PWB.

Although many materials are listed above, embodiments of the present invention are not restricted to the use of the above materials. Other materials can be used in combination with the manufacturing techniques described below to construct PWBs in accordance with the present invention.

Figure 3:
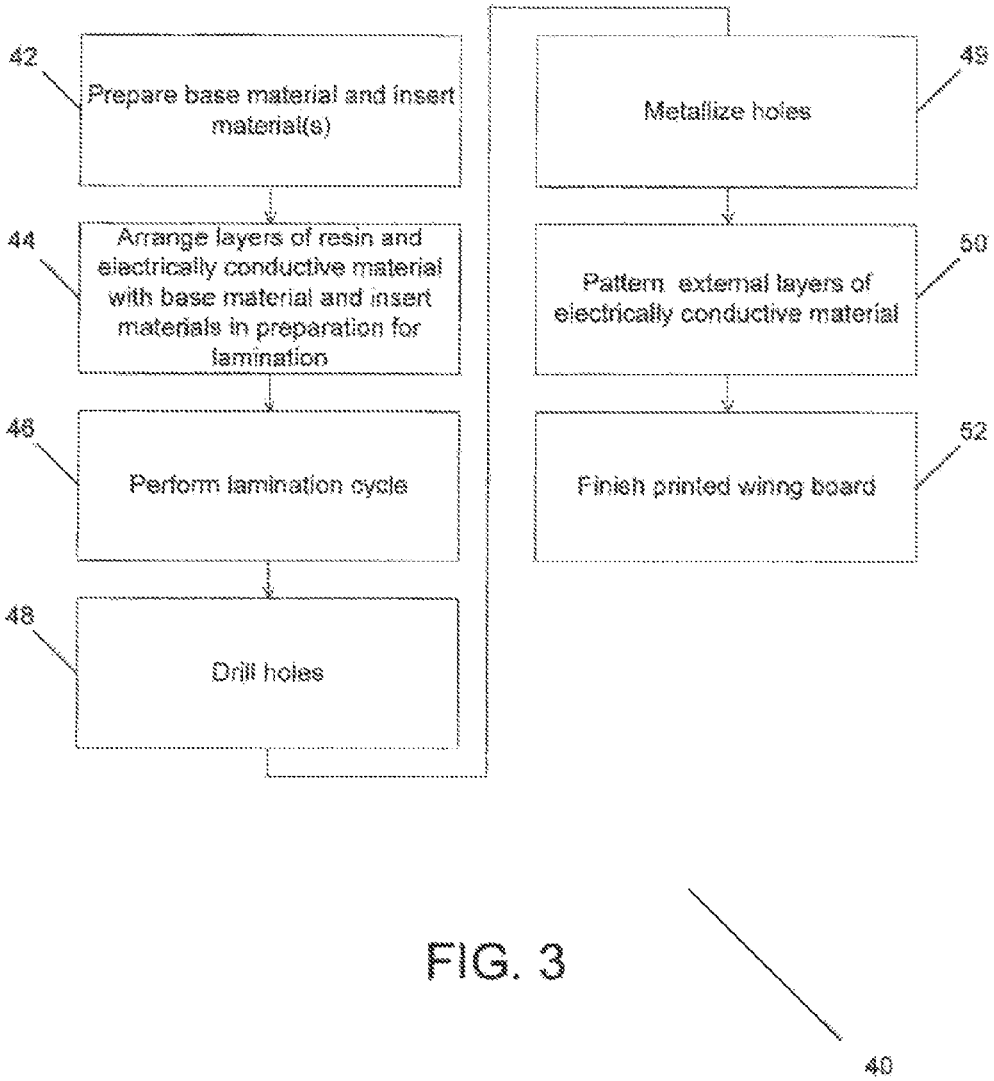
FIG. 3 is a flow chart illustrating a process for manufacturing a printed wiring board from a base material and dielectric inserts in accordance with an embodiment of the invention.
Figure 5:
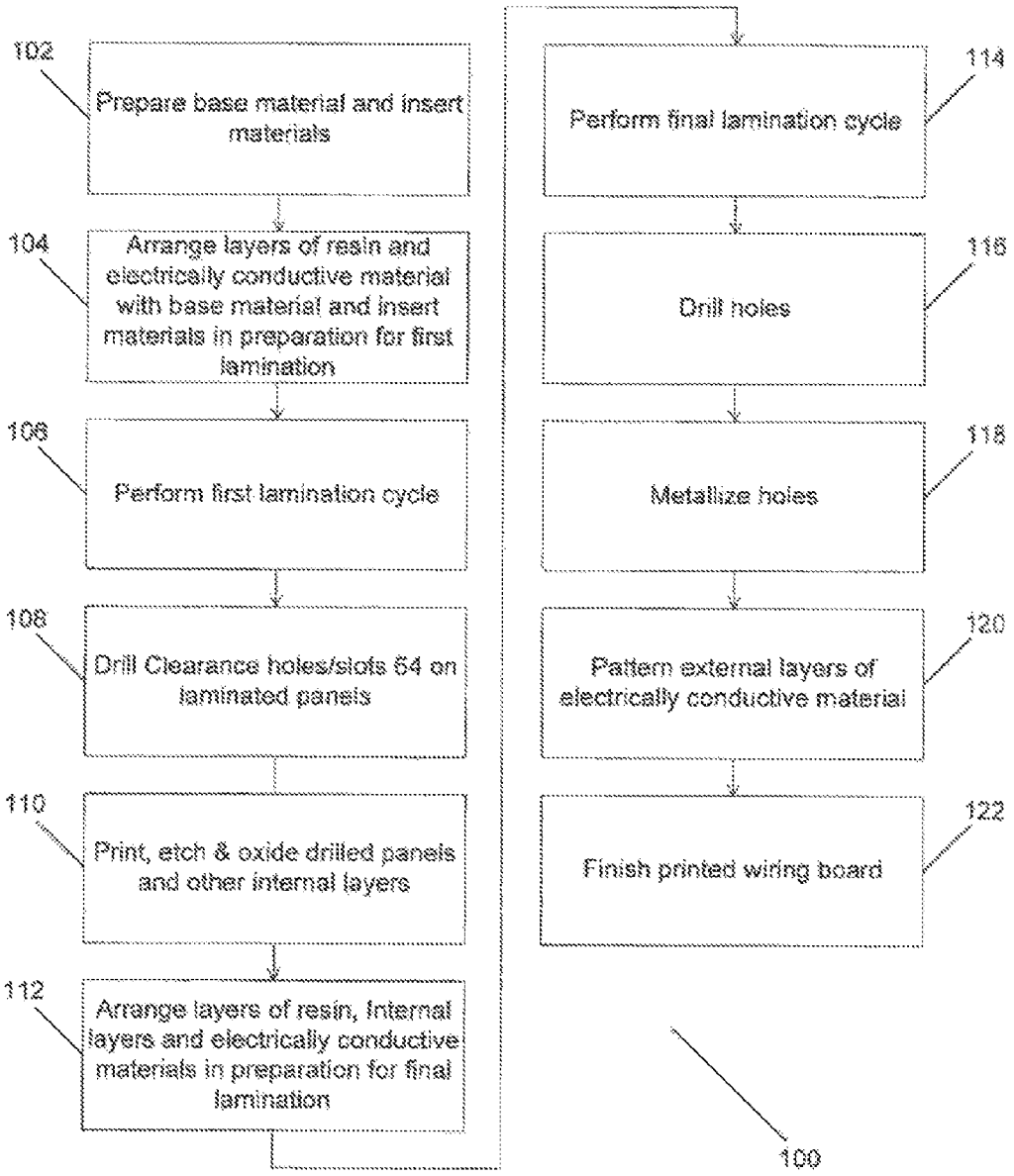
FIG. 5 is a flow chart illustrating a process for manufacturing a printed wiring board from a base material and at least one non-dielectric (or electrically conductive) insert material in accordance with an embodiment of the invention.

The method used to construct a PWB in accordance with the present invention is dependent upon the materials that are used to form the constraining core 20. The variation in the manufacturing processes relates to the electrical conductivity of the materials used in the construction of the PWB. In many instances, a layer of a PWB can be constructed by cutting out sections of a base material and substituting insert materials in the cut out sections. A first process that can be used in embodiments of the present invention where the insert materials used in the construction of the PWB are all dielectric and the resin used to combine the base and insert materials is also dielectric is shown in FIG. 3. A second process that can be used in embodiments of the present invention, where at least one of the insert materials used in the construction of the PWB is non-dielectric and/or the resin used to combine the base and insert materials is non-dielectric is shown in FIG. 5. Examples of embodiments of each type of process in accordance with the present invention are discussed below.

A method of constructing PWBs in accordance with an embodiment of the present invention that involves using dielectric insert materials to create regions possessing physical properties differing from the properties of the remainder of the PWBs is illustrated in FIG. 3. The method shown in FIG. 3 can be used to construct the embodiment of the PWB illustrated in FIG. 2 and other embodiments where all of the insert materials and the resin used to combine the base and insert materials are dielectric. The method 40 involves preparing (42) a base material and insert materials. The preparation of the materials can include the removal of sections of the base material and the cutting of insert materials to fit the removed sections of base material. The prepared base and insert materials are then arranged (44) with dielectric layers and layers of electrically conductive material in preparation for lamination. The dielectric layers and layers of electrically conductive material can take the form of clad or unclad prepregs and laminates. A lamination cycle is then performed (46) to create a printed wiring board subassembly. Holes can be drilled (48) in portions of the printed wiring board subassembly and the linings of the holes plated (491 with electrically and/or thermally conductive material. The plated printed wiring board subassembly is printed and etched (50) to form a completed PWB. The PWB is then finished (52) and components can be mounted on the PWB.

Materials and printed wiring board subassemblies that are utilized during the manufacturing process shown in FIG. 3 in accordance with an embodiment of the present invention are illustrated in FIGS. 4a-4h. As described above, the process for manufacturing PWBs shown in FIG. 3 includes preparing a base material 60 and insert materials 62. These materials are the materials that are used to construct layers similar to the constraining core 20 shown in FIG. 2. The base material 60 is the material that makes up the majority of the constraining core 20.

In the illustrated embodiment, the base material 60 is non-dielectric and clad on both sides with layers of electrically conducting material such as copper. In other embodiments, the base material 60 can be dielectric and/or can be clad on one side or unclad. In embodiments where the base material is non-dielectric, the predrilling of the base material prior to lamination is typically necessary.

The base material can be prepared by drilling clearance holes 64 and cutting out sections 66. The drilled clearance holes are ultimately filled with resin and can electrically isolate the non-dielectric base material from conductive platings of vias drilled through the PWB. The cut out sections ultimately define the regions of the completed PWB that have physical properties (such as CTE), which differ from properties of other regions of the PWB.

As discussed above, the insert material 62 is dielectric. Each of the insert materials is cut to a size that will fit within the appropriate cut out section 66 of the base material. Typically, the insert material is cut with dimensions that are slightly smaller than the cut out region. In one embodiment a gap 68 of 30 mil can be used. In other embodiments, the gap 68 can be a distance ranging from 10 mil to 125 mil. The gap 68 between the insert material 62 and the base material 60 typically is filled with bonding material such as an adhesive or resin.

As part of the manufacturing process, the prepared base and insert materials are arranged (44) with dielectric layers 70 and layers of electrically conductive material 72 in preparation for the lamination cycle. This process can be understood with reference to FIGS. 4c-4e. The materials are arranged by initially taking a laminate 74 clad on both sides with electrically conductive material 72 and stacking a first prepreg 76 on top of the clad laminate. Typically, the electrically conductive layer adjacent the prepreg is etched with circuit patterns. In the illustrated embodiment, the clad laminate 74 and the first prepreg 76 are manufactured using any of the well known manufacturing techniques employed by those of ordinary skill in the art.

Figure 4A:
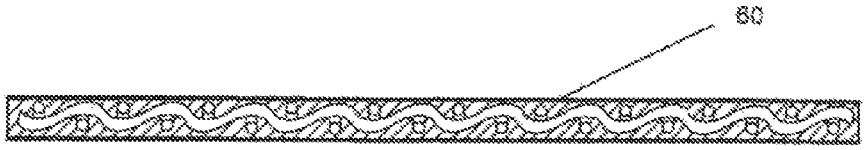
FIGS. 4a-4h are schematic cross-sectional views of various printed wiring board subassemblies that are constructed as part of the manufacturing process illustrated in FIG. 3.
Figure 4B:
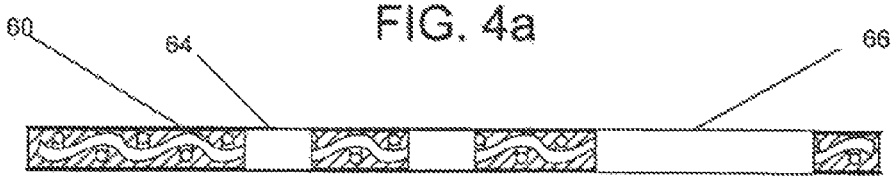
Figure 4C:
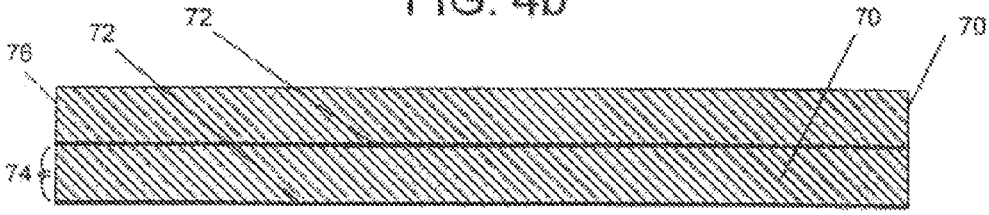
Figure 4D:
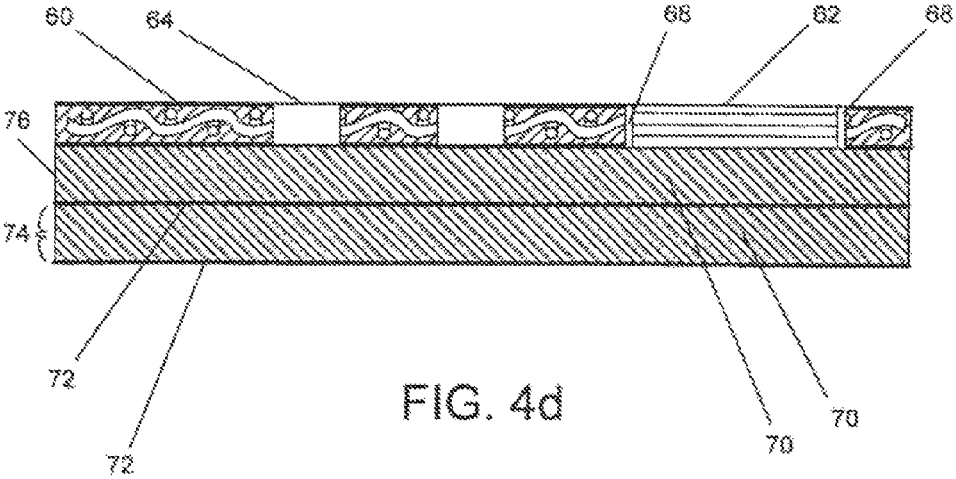
Figure 4E:
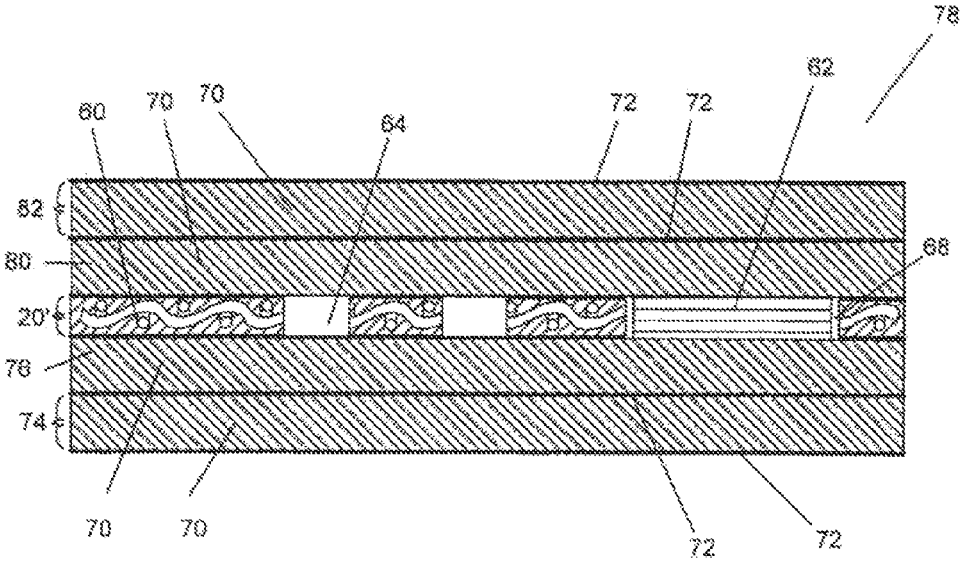

The base material 60 is then placed on top of the first prepreg 76. As discussed above, the base material can be prepared by drilling clearance holes 64 and creating cut out sections 66. The insert materials 62 are then placed in the cut out sections 66. The insert materials 62 are cut to leave a gap 68 with the base material 60 when they are inserted into the cut out sections 66. The arrangement 78 is completed by placing a second prepreg layer 80 on top of the layer formed by the base material 60 and the insert materials 62. A laminate clad on both sides with layers of electrically conductive material 82 is then placed on top of the second prepreg. The electrically conductive layer 82 adjacent the second prepreg can be pre-etched with circuit patterns. The resulting arrangement is illustrated in FIG. 4e. Although the illustrated embodiments include a prepreg and a laminate above and below the base material 60, other embodiments can include more than one patterned clad laminate and/or prepreg on either side of the base material 60 in order to form multiple functional layers. Indeed, a PWB in accordance with the present invention can be constructed using two prepregs, each clad on one side, that are positioned above and below the layer formed by the base and insert materials. Furthermore, many embodiments include multiple layers formed by combining a base material with at least one insert material.

A lamination cycle is then performed (46). The nature of the lamination cycle is dependent upon the nature of the prepregs and dielectric layers used in the arrangement 78. Manufacturers of resins, prepregs and laminates specify the temperature and pressure conditions that are recommended during lamination. The lamination cycle can be performed by adhering to the manufacturer's recommendations for the various materials used in the construction of the PWB.

Figure 4F:
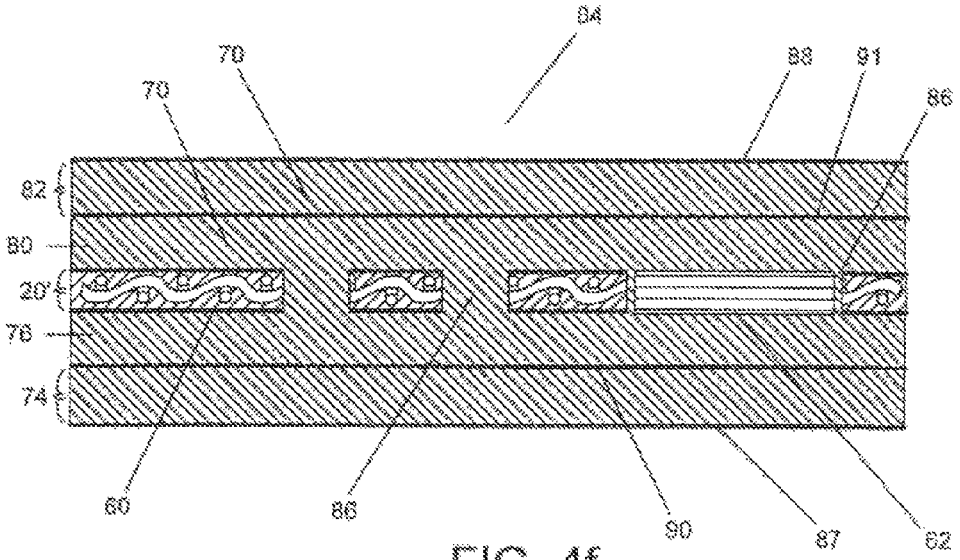

The lamination cycle produces the printed wiring board subassembly 84 in accordance with an embodiment of the present invention shown in FIG. 4f. As a result of the lamination cycle, resin 86 fills the gaps 68 between the base 60 and insert 62 materials and bonds them together. The resin 86 also fills the clearance holes 64 and bonds the layers of electrically conductive material 90 and 91 to the layer 20' formed by the base 60 and insert 62 materials.

Figure 4G:
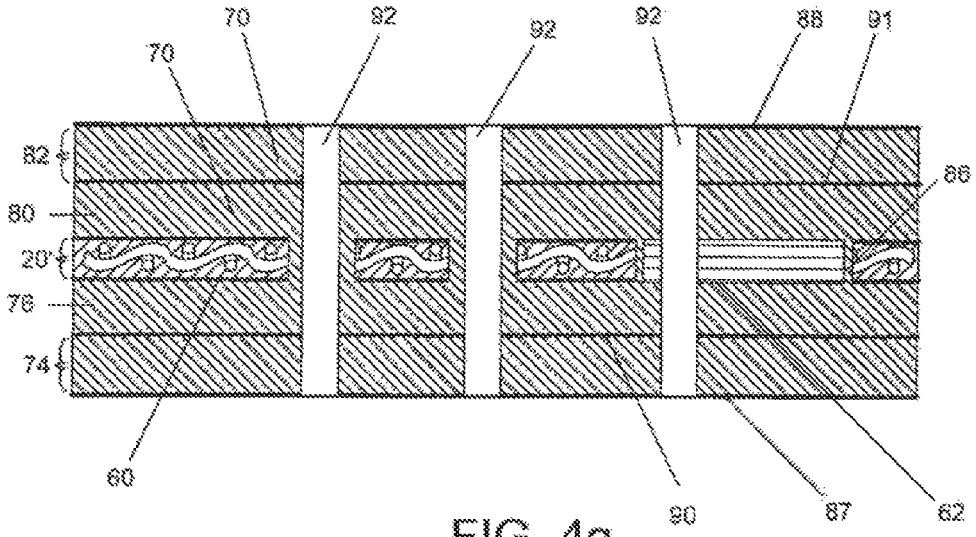
Figure 4H:
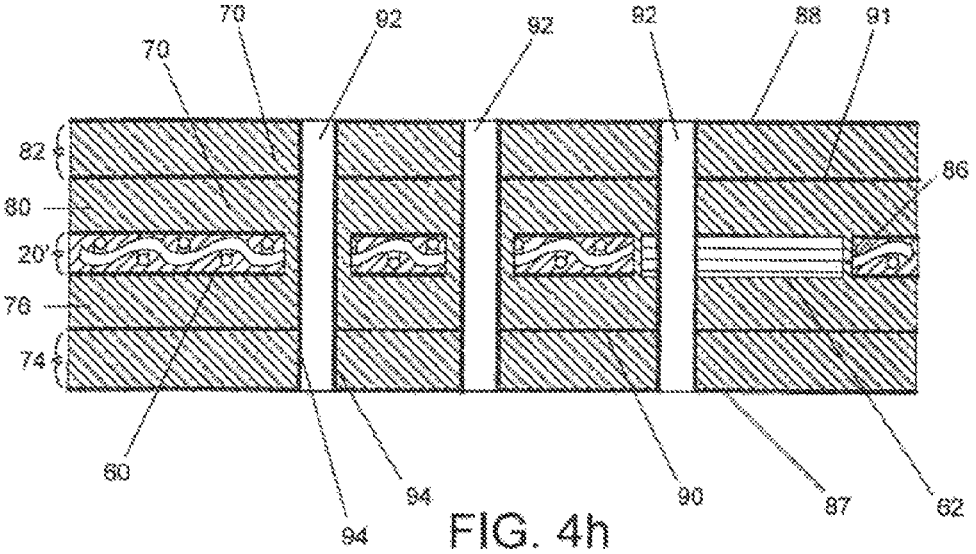

Through holes are drilled (48) in the printed wiring board subassembly. A drilled printed wiring board subassembly is shown in FIG. 4g. The printed wiring board subassembly includes a number of holes 92 that extend through each of the layers of the printed wiring board subassembly.

Once the holes have been drilled, the holes are plated (49) and the layers of electrically conductive material are printed and etched (50). These processes create circuits on and between the layers of the PWB. As discussed above, the functional layers can include layers of electrically conductive material and regions of the layer 20'. The circuits created between the functional layers can be used to carry electrical signals. A completed PWB (i.e., a PWB to which electronic devices are connected or mounted) similar to the completed PWB shown in FIG. 2 can be created by mounting electronic devices on the PWB.

As discussed above, the method used to construct a PWB in accordance with the present invention is dependent upon the materials that are used to form the layers of the PWB. An embodiment of the method of the present invention that can be used where a layer of the PWB includes a base material and at least one insert material that is non-dielectric and/or the resin used to combine the base and insert materials is non-dielectric is illustrated in FIG. 5. The process 100 includes preparing (102) a base material and insert materials. The prepared base material and insert materials are then arranged (104) with layers of resin and electrically conductive material in preparation for lamination. A first lamination cycle is then performed (106) to create a printed wiring board subassembly. Holes can then be drilled (108) through the printed wiring board subassembly to create clearance holes. The printed wiring board subassembly can then be printed, etched and oxided (110). The printed wiring board subassembly can then be arranged (112) with layers of resin and layers of electrically conductive material in preparation for a second lamination cycle. The second lamination cycle is then performed (114) to produce a second printed wiring board subassembly. The second printed wiring board subassembly can have holes drilled (116) in it. The holes can be lined (118) with electrically and/or thermally conductive material. Once the holes are lined, the printed wiring board subassembly can be printed and etched (120) and the board finished (122).

Materials and printed wiring board subassemblies that are utilized during the manufacturing process shown in FIG. 5 are illustrated in FIGS. 6a-6k. As described above, the process for manufacturing PWBs in accordance with the present invention illustrated in FIG. 5 includes preparing a base material 60' and insert materials 62'. These materials are the materials that are used to construct a layer similar to the constraining core 20 shown in FIG. 2. As in the method illustrated in FIG. 3, the base material makes up the majority of the constraining core 20 and is prepared by cutting out portions of material. These cut out portions 66' ultimately contain the insert materials 62', which define the portions of the completed wiring board that can have physical properties (such as CTE) differing from the physical properties of other regions of the board.

In the illustrated embodiment, the base material 60' can be either dielectric or non-dielectric and the insert material 62' is non-dielectric. Each of the insert materials is cut to a size that will fit within the appropriate cut out section 66' of the base material 60'. As discussed above, the insert materials are cut with dimensions that are slightly smaller than the cut out regions 66' and can have similar tolerances as those discussed in relation to FIGS. 3 and 4a-4h.

During manufacture, the prepared base and insert materials are arranged (104) with layers including resin. In many embodiments, the layers including resin are in the form of a prepreg. The prepregs can be substrates impregnated with a dielectric resin and/or resin films. Typically, the resin used in the prepregs is chosen to fill the cutout clearance around the insert materials during lamination.

Figure 6A:
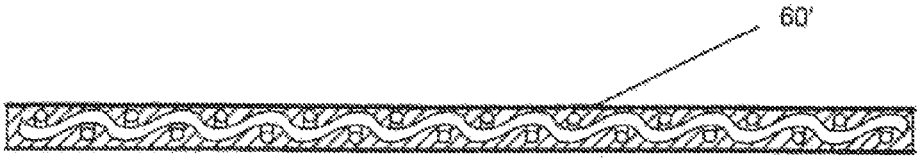
FIGS. 6a-6k are schematic cross-sectional views of various printed wiring board subassemblies that are constructed as part of the manufacturing process illustrated in FIG. 5.
Figure 6B:
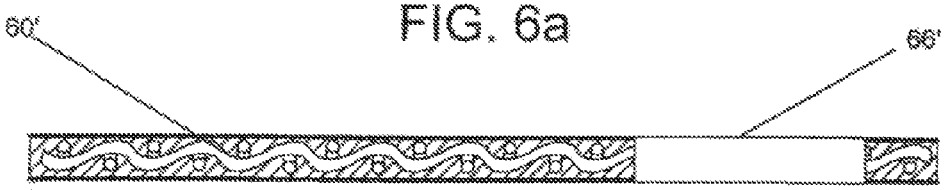
Figure 6C:
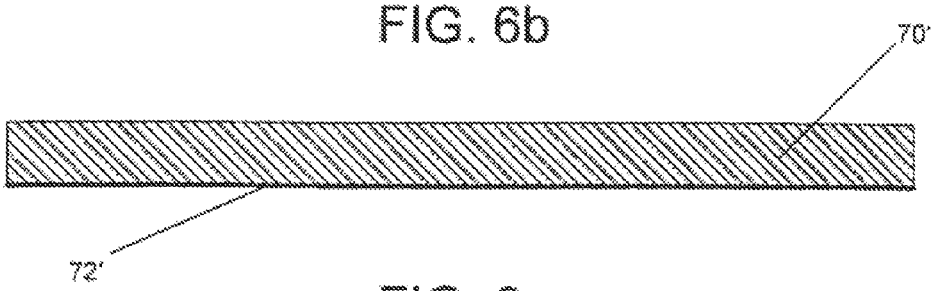
Figure 6D:
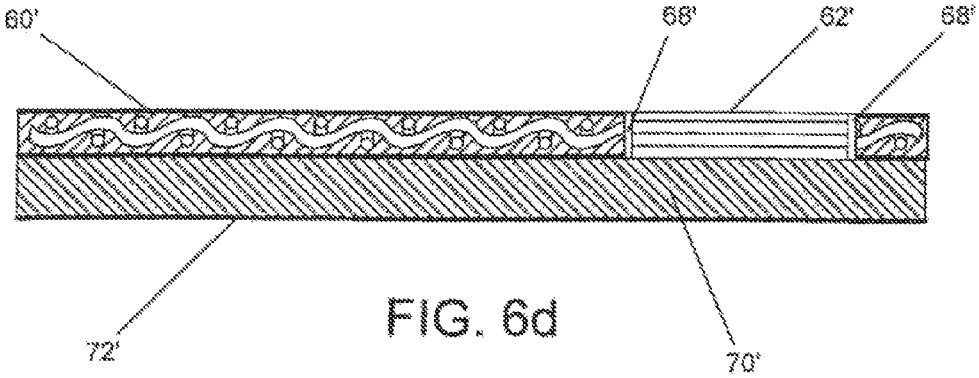
Figure 6E:
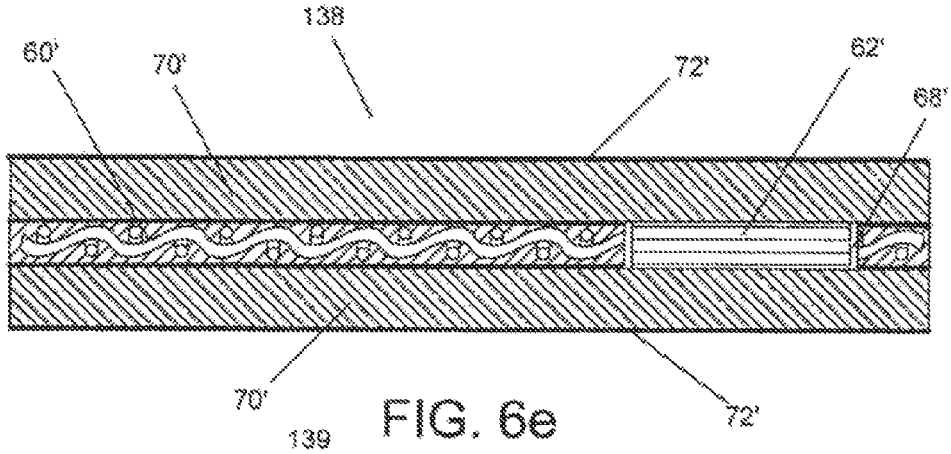

The arrangement of the base material, insert materials and layers including resin can be understood with reference to FIGS. 6a-6e. Initially a layer of prepreg 70' is stacked on a foil 72' (see FIG. 6c), then the base material 60' is placed on top of the prepreg and the insert materials 62' are placed in the cut out portions 66' of the base material. The arrangement is completed by placing a second prepreg 70' on top of the layer formed by the base material 60' and the insert materials 62' and then placing a second foil 72' on top of the second prepreg. The final arrangement 138 is illustrated in FIG. 6e. In other embodiments, prepregs clad on one side can be used.

Figure 6F:
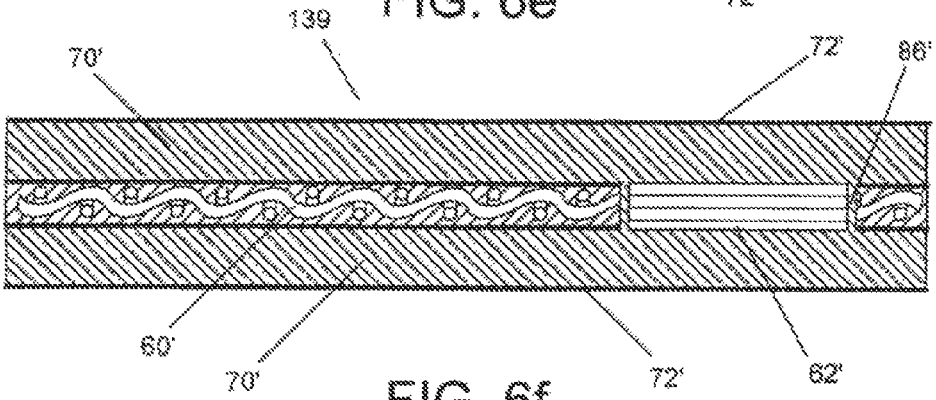

A first lamination cycle is performed (106) to produce the printed wiring board subassembly 139 shown in FIG. 6f. Typically, the lamination cycle is performed in accordance with the manufacturer's recommendations for the various materials used to form the arrangement 138. During the lamination, resin from the prepregs 70' flows to fill the gaps 68' between the base material 60' and the insert materials 62'. During the lamination, the resin softens, gels and cures thus bonding the base material 60' to the insert materials 62'. The resin also bonds the layer formed by the base material 60' and the insert materials 62' to the layers of electrically conductive material 72'.

Figure 6G:
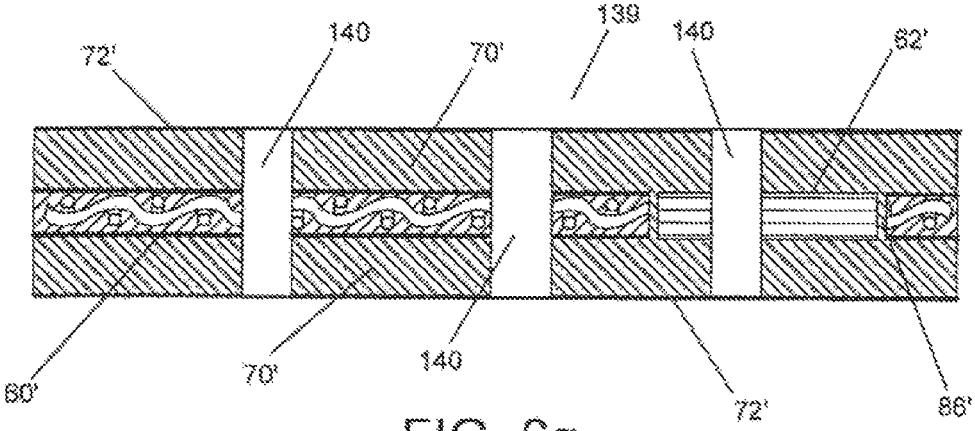
Figure 6H:
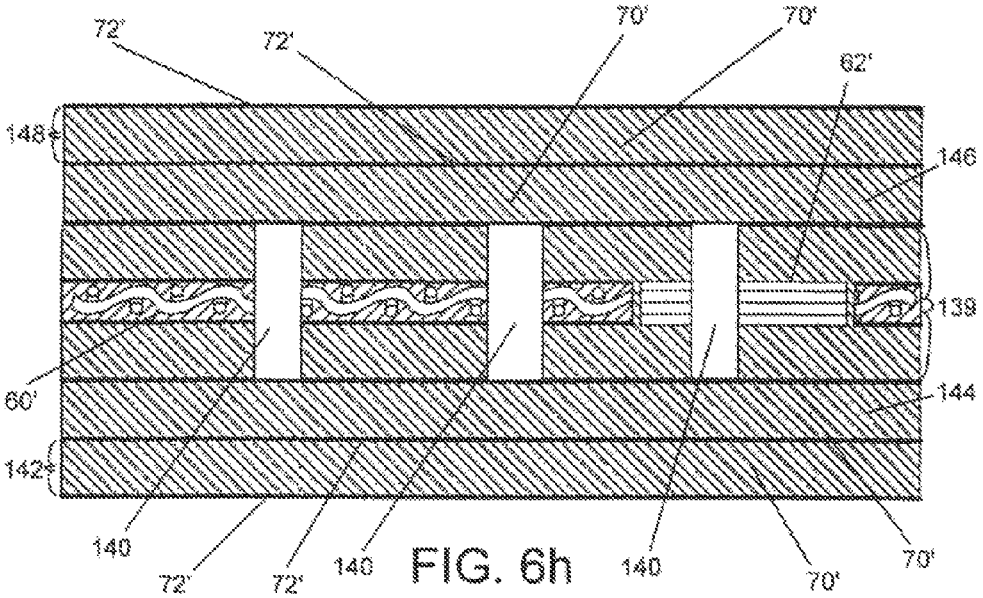

Following the lamination, clearance holes 140 can be drilled (108) in the printed wiring board subassembly 139. A printed wiring board subassembly in which clearance holes 140 have been drilled is illustrated in FIG. 6g. Ultimately, the clearance holes are filled with a dielectric material, such as a dielectric resin, and plated vias are drilled through the resin filled clearance holes. The dielectric material filling the clearance holes serve to electrically isolate the base material 60' and the insert materials 62' from the plated vias drilled through the clearance holes.

Following the clearance hole drilling, the layers of electrically conductive material are printed, etched and oxided (110) to create clearance pads and remove debris. The printed wiring board subassembly can then be arranged (112) with prepregs 70' and layers of electrically conductive material 72' in preparation for a second lamination cycle. In one embodiment, a stack is formed using a laminate 142 clad on both sides with layers of electrically conductive material and prepreg 144 located between the printed wiring board subassembly 139 and the laminate. The laminate 142 is etched with a circuit pattern on the layer of electrically conductive material that faces the prepreg 144. The stack can then be completed by adding another prepreg 146 and then another laminate 148 clad on both sides with layers of electrically conductive material. The laminate 148 is etched with circuit patterns on the layer of electrically conductive material that faces the prepreg 146. The construction of the clad laminates 142 and 148 and the prepregs 144 and 146 can be achieved using conventional manufacturing techniques. Although, the stack shown in FIG. 6h includes a prepreg and a clad laminate above and below a printed wiring board subassembly, embodiments of the present invention can include a prepreg clad on one side above and below the printed wiring board assembly. Alternatively, embodiments of the present invention can include more than one prepreg and/or laminate. In many embodiments, multiple printed wiring board subassemblies can be combined in a single stack to create a PWB. In addition, the printed wiring board subassembly can be used as a layer in the construction of a PWB in accordance with the method shown in FIG. 3.

Figure 6I:
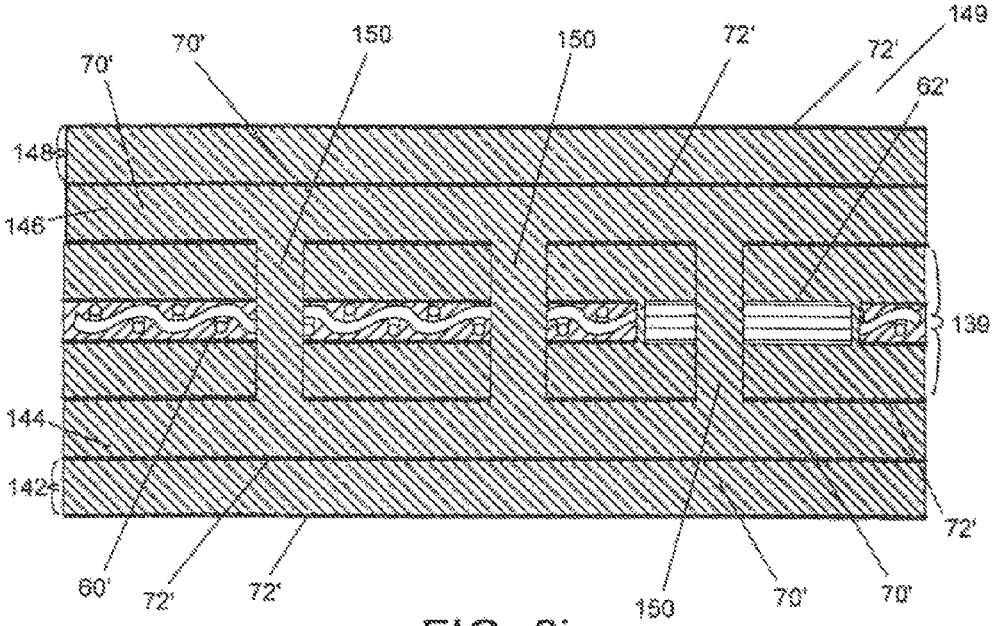

A second lamination cycle is performed (114) in order to produce a second printed wiring board subassembly 149 shown in FIG. 6i. Again, the nature of the lamination cycle performed is dependent upon the manufacturer's recommendations for the materials used in the construction of the PWB. During the lamination, resin 150 from the prepregs 144 and 146 flows to fill the holes 140. Following the lamination, the resin in the prepregs 144 and 146 bonds the layers of the second printed wiring board subassembly together.

Figure 6J:
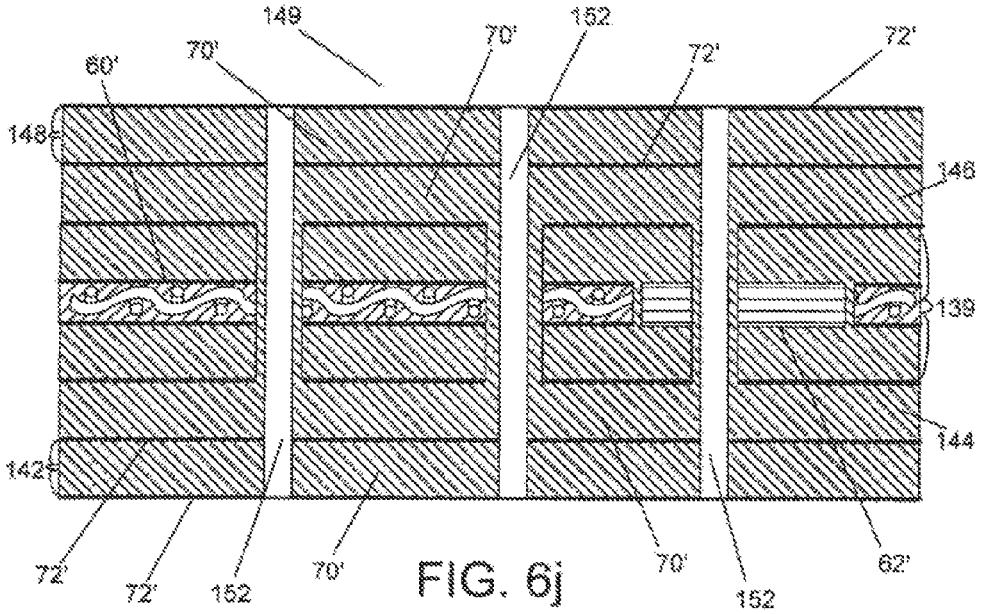
Figure 6K:
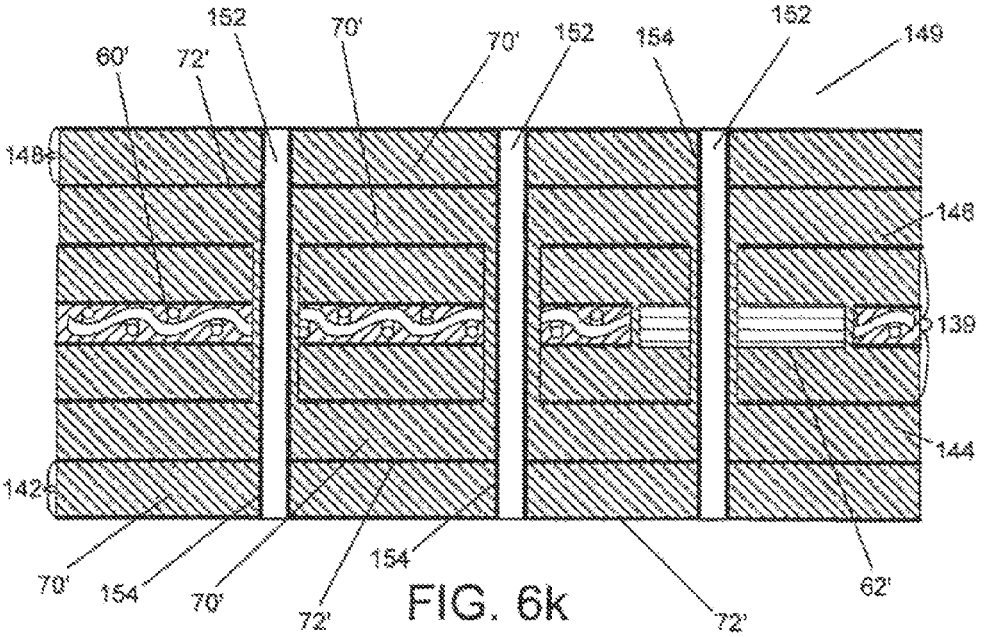

Once the second lamination cycle is complete, holes 152 can be drilled (116) in the second printed wiring board subassembly with a view to creating mounting holes and plated vias. An embodiment of a second printed wiring board subassembly 149 with holes 152 drilled through it is shown in FIG. 6j. The holes can then be lined (118) to create plated vias 154 as is shown in FIG. 6k. Following the lining of the holes, the external layers of the PWB can be printed and etched (120) prior to the finishing (122) of the PWB and the mounting of any components on the PWB.

Figure 7:
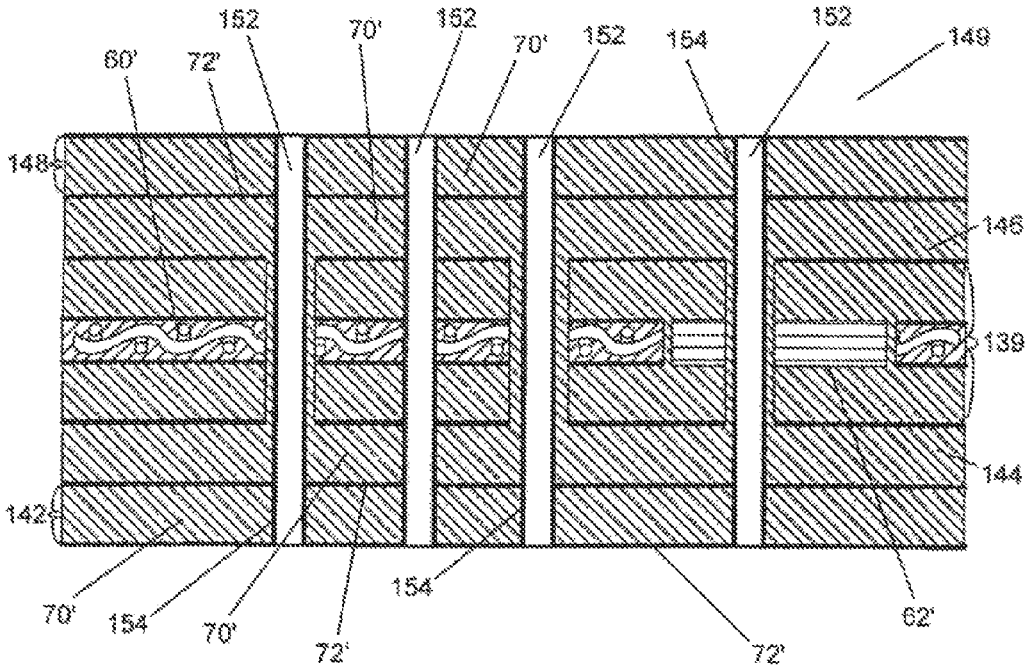
FIG. 7 is a schematic cross-sectional view of a printed wiring board including plated through holes in accordance with an embodiment of the invention.

An embodiment of a PWB 160 in accordance with the present invention that includes a base material that acts as a functional layer within the PWB is shown in FIG. 7. The illustrated PWB 160 can be constructed in accordance with the process illustrated in FIG. 5. Electrical connections are established between the base material and circuits patterned on other electrically conductive layers of the PWB using plated through holes 162.

Although specific materials have been referred to above in the discussion of manufacturing PWBs in accordance with the present invention, any material that can be used in the manufacture of a PWB can be used as either the base material or as an insert material in the manufacture of PWBs in accordance with the present invention. The combination of materials to form a PWB in accordance with the present invention is largely dependent upon the glass transition temperatures of the materials. In embodiments where a C-stage material (i.e., a material that has already undergone a full cure cycle) is used as the insert materials, then the base material can be a B-stage material (i.e., a material that is semi-cured) with a glass transition temperature that is equal to or lower than the glass transition temperature of the C-stage insert material. The same is also true when the base material is a C-stage material and an insert material is a B-stage material. In addition, similar care in the choice of the resin used to combine the base and insert materials should be used when the base and insert materials are C-stage materials. Once materials have been selected, the manufacturing method chosen depends upon whether any of the insert materials and/or the resin used to combine the base material and insert materials are non-dielectric. As discussed above, if the insert materials and the resin used to combine the base material and insert materials are dielectric then either the process shown in FIG. 3 or the process shown in FIG. 5 can be used to manufacture a PWB. If one of the insert materials is electrically conductive and a plated via passes through that insert material, then the process shown in FIG. 5 is typically used.

The methods described above involve techniques for manufacturing PWBs that include constraining cores combining base and insert materials. Referring now to FIGS. 8-18g, generalized methods for constructing PWBs that include various different types of constraining cores are disclosed that do not require the constraining core to undergo a lamination cycle prior to combination of the constraining core with other materials used in the construction of the PWB. In a number of embodiments, a PWB is constructed using a single lamination cycle. In other embodiments, a PWB is constructed using multiple lamination cycles. In many embodiments, a single lamination cycle is used to fill clearance patterns and/or bond base and insert substrate materials and to combine the constraining core with adjacent functional layers.

Figure 8:
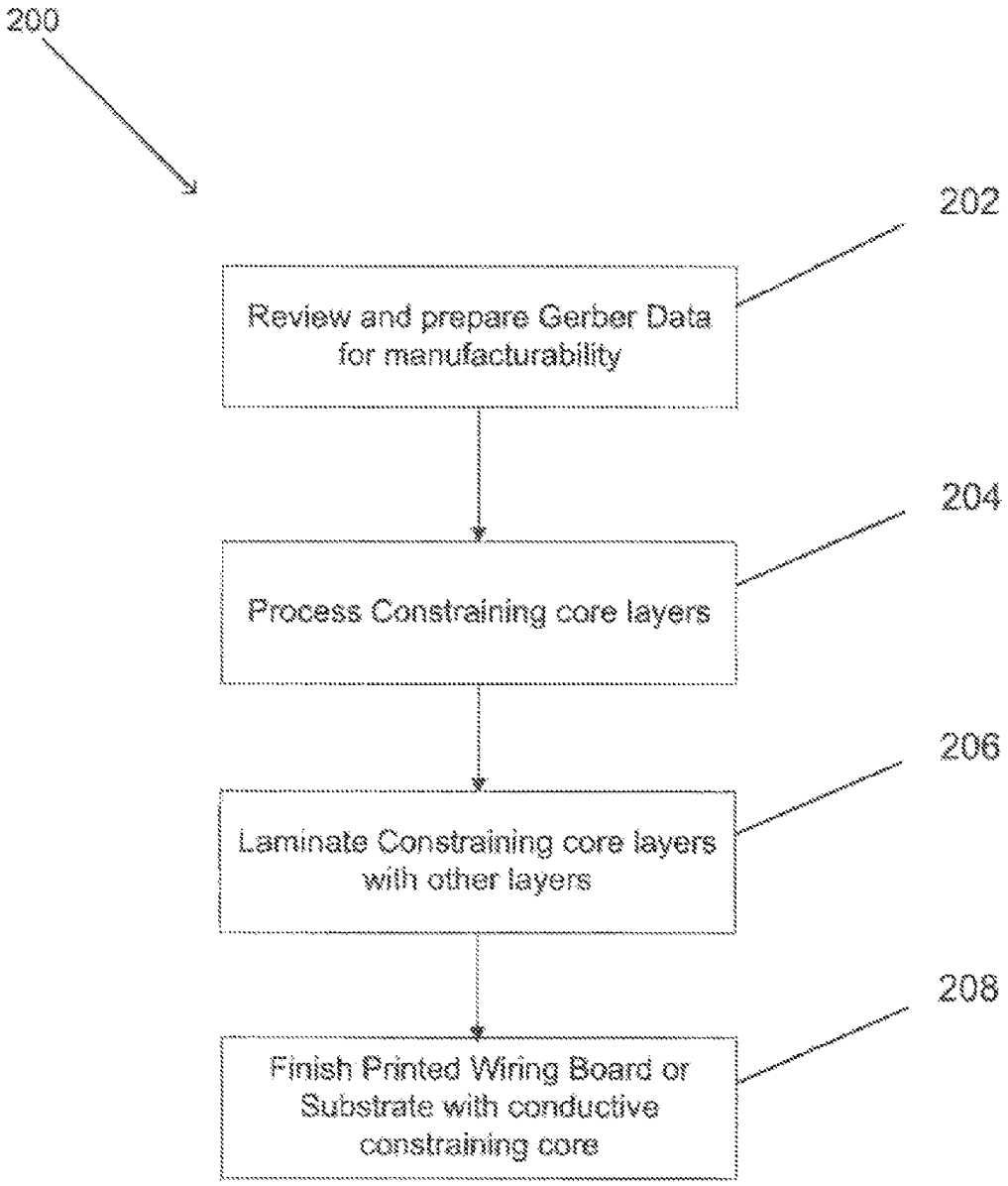
FIG. 8 is a flow chart illustrating a process for manufacturing a printed wiring board in accordance with an embodiment of the invention.

A process for manufacturing a PWB including at least one constraining core in accordance with an embodiment of the invention is shown in FIG. 8. The process 200 includes reviewing and preparing Gerber data (202) for manufacturability of the PWB. The review can involve determining the smallest trace size, smallest gap between traces, smalles via hole size, drilling aspect ratio, signal impedance requirement, dimensional tolerances, surface finish requirement, flatness tolerances and/or final cutting requirement. In many embodiments, the PWB design includes insert materials with CTEs matched to the CTE of components mounted on the PWB. The constraining core layers are then processed (204) and laminated with other internal layers (206) using B-stage (semi-cured) dielectric prepregs. Following the lamination, the PWB can then be finished (208). Although the above process includes a single lamination cycle, in other embodiments a patterned constraining core can be combined with B-stage dielectric prepregs and materials used to construct other layers of a PWB in a first lamination cycle and the PWB completed in subsequent lamination cycles.

Gerber data for PWBs including an embodiment of the present invention typically includes functional layers and non-functional layers. The functional layers include signal layers, signal routing layers, trace layers, circuit layers, ground plane layers, power plane layers, split plane layers, reference plane layers, ground thermal plane layers, mix plane layers, buried passive layers and layers that contribute to electrical communication with integrated circuits, bare dies and/or other devices connected to the PWB. The non-functional layers typically include fab drawings, drill drawings, drill data, solder mask layers, silk screen layers, solder paste layers, thermal plane layers, mechanical stiffener layers, structural layers and other layers that do not contribute to electrical communication with devices connected to the PWB.

Figure 9:
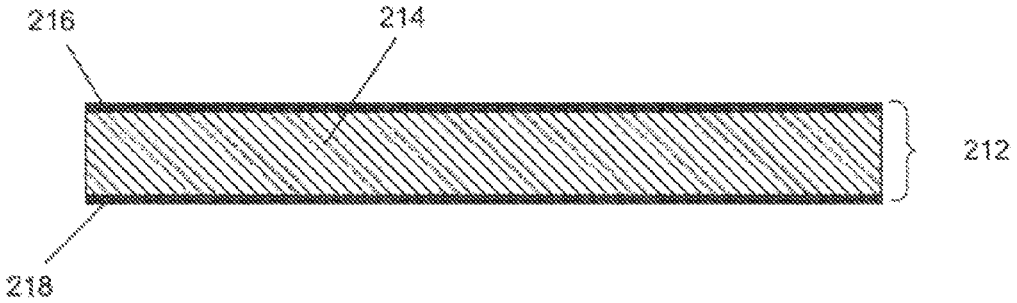
FIG. 9 is a schematic cross sectional view of an electrically conductive constraining core in accordance with an embodiment of the invention.

A cross-sectional view of a constraining core in accordance with an embodiment of the invention is shown in FIG. 9. A constraining core 212 includes an electrically conductive layer 214 sandwiched between a first cladding layer 216 and a second cladding layer 218. Although the embodiment shown in FIG. 9 includes cladding on both sides, embodiments of constraining cores in accordance with the invention can include cladding on one side only. The configuration shown in FIG. 9 and involving a constraining core having cladding layers on one or both sides of the constraining layer can be referred to as a "clad composite laminate" or a "clad laminate".

The constraining core 212 is capable of conducting electricity from the first cladding layer 216 through the electrically conductive layer 214 to the second cladding layer 218. In a number of embodiments, the constraining core has a dielectric constant greater than 6 at 1 MHz. As is discussed below, a variety of materials can be used in the construction of a constraining core in accordance with embodiments of the invention. The selection of the materials used in the construction of a constraining core can depend on the benefits required at the final product level such as heat transfer rate, coefficient of thermal expansion, stiffness and combinations of these.

In one embodiment, the electrically conductive layer can be constructed using fibrous material impregnated with resin. In a number of embodiments, the fibrous material is carbon, graphite fibers such as CN80-3k, CN80-1.5k, CN-60, CN-50, YS-90 manufactured by Nippon Graphite Fiber of Japan, K13B12, K13C1U, K63D2U manufactured by Mitsubishi Chemical Inc. Japan or T300-3k, T300-1k, K800, K1100 manufactured by Cytec Carbon Fibers LLC of Greenville, S.C. In other embodiments metallized fibers are used in the construction of the electrically conductive layer. Fibrous material can be metallized by metallizing individual fibers and forming the metallized fibers into a fabric, the fibers can be formed into a fabric and then metallized or a combination of both metallization processes can be used. Fibers that can be metallized include carbon, graphite, E-glass, S-glass, Aramid, Kevlar, quartz, liquid crystal polymers or combinations of these fibers. Once metallized, an electrically conductive layer can be formed in accordance with the invention by impregnating the metallized fibers with resin.

In one embodiment, the fibrous material that is impregnated with resin can be continuous carbon fiber. In other embodiment, the fibrous material can be discontinuous carbon fiber. Examples of suitable discontinuous fibers include spin broken fibers such as X0219 manufactured by Toho Carbon Fibers Inc. Rockwood, Tenn.

The fibrous material used in the construction of constraining cores in accordance with embodiments of the invention can be woven or non-woven. Non-woven material can be in the form of a Uni-tape or a mat. Examples of suitable carbon mats include grade number 8000040 and 8000047, 2 oz and 3 oz respectively manufactured by Advanced Fiber Non Wovens, East Walpole, Mass. In other embodiments, any combination of fibrous material and resin can be used that results in a layer possessing a dielectric constant that is greater than 6.0 at 1 MHz.

In several embodiments, the conductive layer can be constructed from PAN based carbon fiber, Pitch based carbon fiber or a combination of both PAN and Pitch fibers.

A variety of resins can be used to impregnate fibers to construct conductive layers in accordance with embodiments of the invention. In several embodiments, the resin used to can be an Epoxy based resin such as EP387 and EP450 manufactured by Lewcott Corporation located in Millbury, Mass. In a number of embodiments, the resin can be based on Bismaleimide Triazine epoxy (BT), Bismaleimide (BMI), Cyanate Ester, Polyimide, Phenolic or a combination of resins. In many embodiments, the resin used to impregnate fibers includes filler material such as pyrolytic carbon powder, carbon powder, carbon particles, diamond powder, boron nitride, aluminum oxide, ceramic particles, and phenolic particles. In many embodiments, the resin is electrically conductive.

When the conductive layer is constructed from resin impregnated fibers, the conductive layer can derive its electrical properties from the fibers. For example, a conductive layer constructed from graphite fibers impregnated with toughened epoxy. In other embodiments, the electrical properties of the conductive layer can be driven by the resin. For example, a conductive layer constructed from glass fibers impregnated with toughened epoxy resin that has pyrolytic carbon powder as a filler material.

The materials that can be used in the construction of a conductive layer are not limited to resin impregnated fibers. In many embodiments, the conductive layer is constructed from a solid carbon plate. In a number of embodiments, the solid carbon plate is made using compressed carbon or graphite powder. In other embodiments, a solid carbon plate is constructed using carbon flakes or chopped carbon fiber with thermo plastic or thermo setting binder. In many embodiments, the conductive layer can be constructed using C—SiC (Carbon-Silicon Carbide) manufactured by Starfire Systems Inc. located in Malta, N.Y.

Metal cores can also be used. As discussed above, metal cores include thick metal layers, copper-Invar-copper and copper-Molly-copper.

In other embodiments, the materials used in the construction of the conductive layer are not limited to resin impregnated fibrous materials and carbon composites. Any material or combination or materials that can form a layer having a dielectric constant greater than 6.0 at 1 MHz can be used in the construction of an electrically conductive layer.

In many embodiments, the cladding layers are constructed from an electrically conductive material such as a metal. In a number of embodiments, the cladding layers are constructed using copper.

Figure 10:
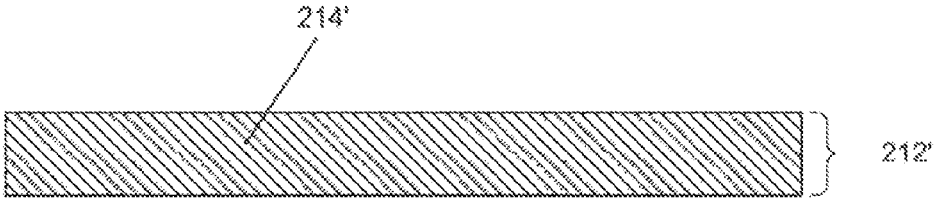
FIG. 10 is a schematic cross sectional view of an electrically conductive constraining core in accordance with an embodiment of the invention.

A cross-sectional view of a constraining core in accordance with another embodiment of the invention is shown in FIG. 10. The constraining core 212' includes an electrically conductive layer 214'. A constraining core that does not have cladding layers on either side can be referred to as an "unclad composite laminate" or an "unclad laminate".

The constraining core 212' is capable of conducting electricity from one major surface to another through the electrically conductive layer 214'. In a number of embodiments, the constraining core 212' has a dielectric constant of 6 at 1 MHz. The electrically conductive layer 214' can be constructed in a similar fashion to the electrically conductive layer 214 described above with respect to FIG. 9.

Figure 11:
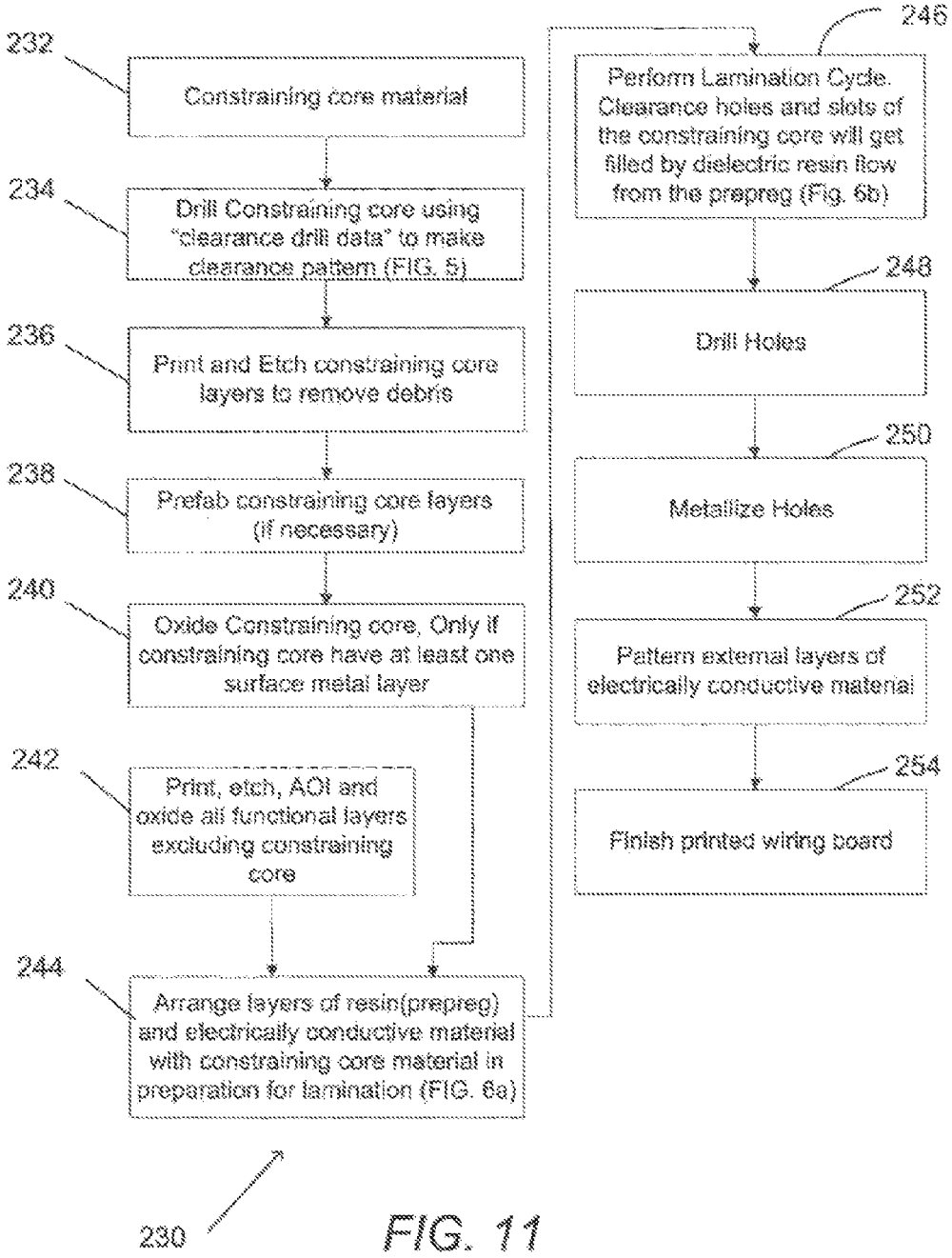
FIG. 11 is a flow chart illustrating a process for manufacturing a printed wiring board in accordance with an embodiment of the invention.

A process for constructing PWBs that incorporate constraining core materials in accordance with an embodiment of the invention is illustrated in FIG. 11. The process 230 involves preparing (232) the materials that will be used to create the constraining cores of the PWB. The preparation of the constraining core materials can include the drilling or punching of tooling holes such as lamination tooling holes. The prepared constraining core materials are then stacked and drilled (234) with a clearance pattern. The drilled constraining core materials are then printed and etched (236) to remove debris and to etch back copper in a region around the periphery of the PWB. A prefab process can also be performed (238) if required. A surface treatment such as a brown oxide treatment applied (240) to the surface of the constraining core materials.

Parallel to the processes described above, the other internal layers of the PWB can be processed (242) using conventional processing techniques to prepare the internal layers for lamination. The internal layers typically include prepregs and layers of electrically conductive material. The processed constraining core layers are then arranged (244) with the processed internal layers in preparation for lamination. A lamination cycle is then performed (246) to create a printed wiring board subassembly. Through holes can be drilled (248) through the printed wiring board subassembly and the linings of the holes plated (250) with electrically and/or thermally conductive material to create PTHs. The external layers of the printed wiring board subassembly can then be printed and etched (252). The PWB is then finished (254) and components can be mounted on the PWB. Although the above process includes a single lamination cycle, in other embodiments a patterned constraining core can be combined with B-stage dielectric prepregs and materials used to construct other layers of a PWB in a first lamination cycle and the PWB completed in subsequent lamination cycles.

The process outlined above enables the construction of a PWB without the use of an additional lamination cycle or special cure cycle to fill clearance holes in the constraining cores. During the lamination cycle (246), dielectric resin from the prepregs arranged on either side of the constraining cores reflows into the clearance holes and slots drilled in the constraining cores. In embodiments where the constraining cores include a base material with insert materials possessing physical characteristics differing from those of the base materials, the dielectric resin from the prepregs reflows into the gaps between the base material and the insert materials. The dielectric resin that flows into cavities within the constraining cores can electrically isolate the constraining core from conductive plating of PTHs drilled through the dielectric resin filled cavities of the constraining core.

Figure 12A:
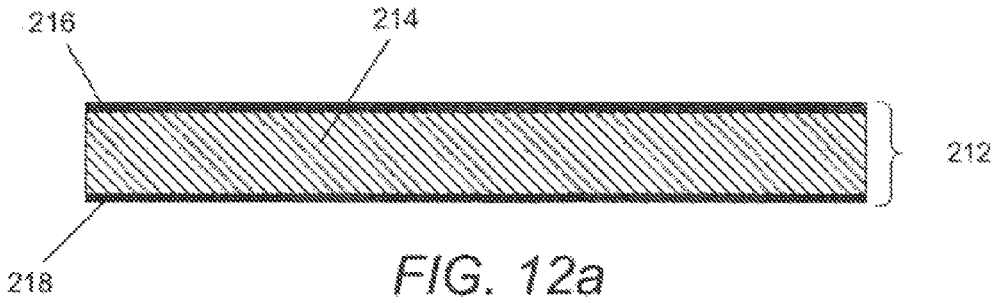
FIGS. 12a-12d are schematic cross-sectional views of electrically conductive constraining cores as various processes are performed during the manufacturing process illustrated in FIG. 11.

Materials used in the construction of constraining cores in accordance with the process shown in FIG. 11 are illustrated in FIGS. 12a-12d. A constraining core similar to the constraining core illustrated in FIG. 9 is shown in FIG. 12a. The constraining core is prepared for use in the manufacture of a PWB by drilling clearance holes. The drilled clearance holes are ultimately filled with resin and can electrically isolate the constraining core materials from PTHs.

Figure 12B:
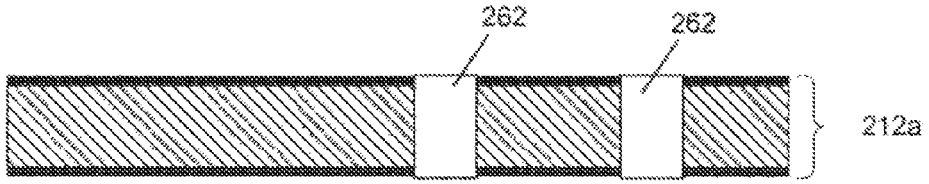
Figure 12C:
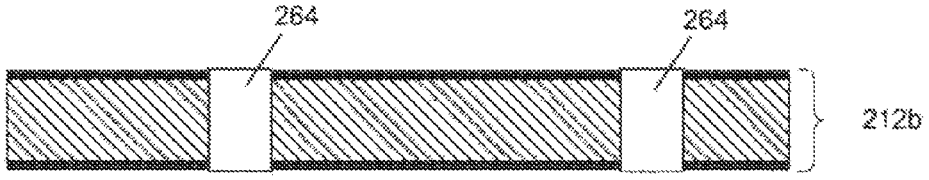
Figure 12D:
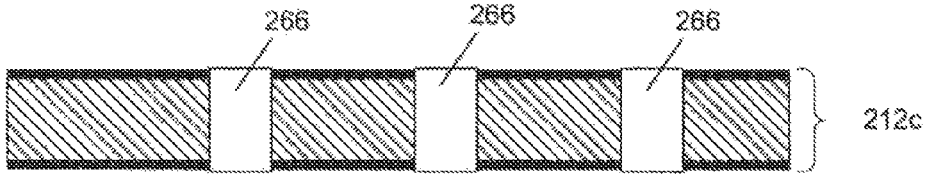

A processed constraining core layer for use as a ground layer in a PWB in accordance with an embodiment of the invention is shown in FIG. 12b. The constraining core 212a includes a first pattern of clearance holes 262. A processed constraining core layer for use as a power layer in a PWB in accordance with an embodiment of the invention is shown in FIG. 12c. The constraining core 212b includes a second pattern of clearance holes 264. A processed constraining core layer for use as a non-functional layer in a PWB in accordance with an embodiment of the invention is shown in FIG. 12d. The constraining core 212c includes a third pattern of clearance holes 266.

Figure 13A:
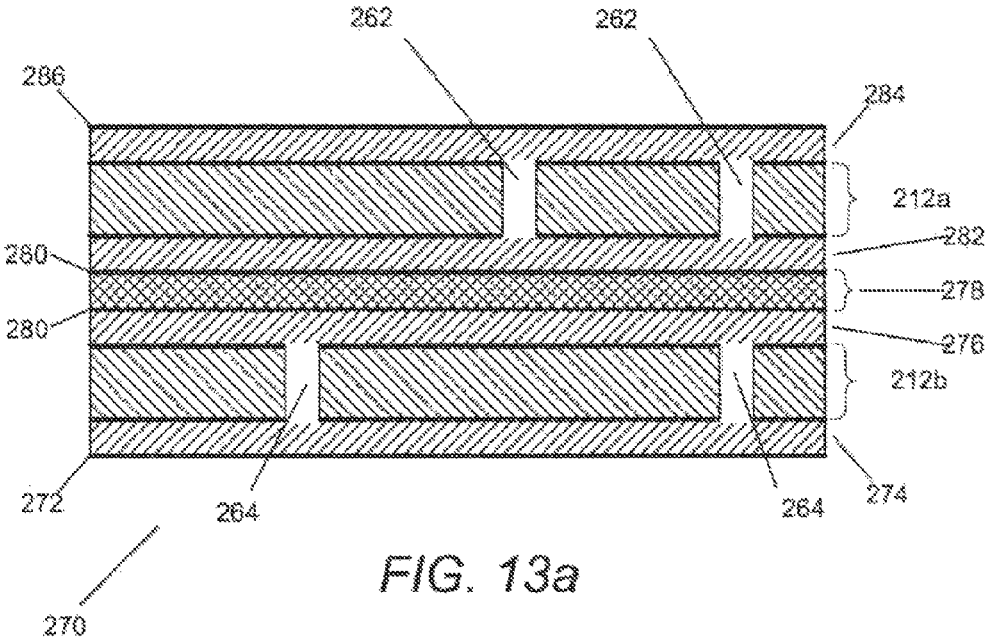
FIGS. 13a-13b are schematic cross-sectional views of printed wiring board assemblies that are constructed as part of the manufacturing process illustrated in FIG. 11.

As discussed above with respect to the manufacturing process shown in FIG. 11, prepared constraining core materials are arranged with layers of prepreg, layers of dielectric core material and layers of electrically conductive material in preparation for a lamination cycle. A stack up of constraining cores, prepregs, layers of dielectric core and layers of electrically conductive material in accordance with an embodiment of the invention is shown in FIG. 13a. The stack up 270 is arranged by initially taking an electrically conductive material (copper foil in this case) 272 and stacking a first prepreg 274 on top of the copper foil. In the illustrated embodiment, the copper foil 272 and the first prepreg 274 are manufactured using any of the well known manufacturing techniques employed by those of ordinary skill in the art.

The constraining core layer 212b is then placed on top of the first prepreg 274. As discussed above, the constraining core layer can be prepared by drilling a pattern of clearance holes 264. Constraining core layer 212b acts as a power layer in the stack-up. A second prepreg 276 is then placed on top of the constraining core layer 212. A laminate 278 clad on both sides with electrically conductive material 280 is then placed on top of the second prepreg 276. Typically, the electrically conductive layers on both sides of the laminate 278 are etched with circuit patterns. A third prepreg 282 is then placed on top of the laminate 278. Another constraining core layer 212a is then placed on top of the third prepreg 282. As discussed above, the constraining core layer can be prepared by drilling a set of clearance holes 262. Constraining core layer 212a acts as a ground layer in the stack-up. A fourth prepreg 284 is located on top of the constraining core layer 212a. The stack up 270 is completed by placing a second layer of electrically conductive material 286 (copper foil in this case) on top of the fourth prepreg layer 284.

Although the stack up illustrated in FIG. 13a includes a prepreg and a laminate above and below each of the constraining core layers, other embodiments can include more than one patterned clad laminate and/or prepreg on either side of the constraining core layers in order to form multiple functional layers. Indeed, a PWB in accordance with the present invention can be constructed using two prepregs, each clad on one side, that are positioned above and below the constraining cores. Furthermore, many embodiments include multiple constraining cores and layers of electrically conductive material separated by dielectric layers.

In one embodiment, prepreg layers used on both sides of the constraining core layers 212a and 212b have very high resin content such as 106 type prepregs. Typical resin content in 106 prepreg is in excess of 70% by volume. In other embodiments, prepreg layers used on both sides of the constraining core layers 212a and 212b have sufficient resin to fill the drilled clearance pattern and provide flat outside surfaces after lamination. In another embodiment, multiple plies of prepregs can be used on either sides of the constraining core layers to fill clearance holes and slots.

In a number of embodiments, prepregs such as 44N106 and 84N106 manufactured by Arlon Materials of Rancho Cucamonga, Calif., can be used to form a stack up in accordance with an embodiment of the invention. In other embodiments, stacks up can include 1080F epoxy manufactured by Hitachi Chemical Co. Ltd. of Japan, polyimide prepregs manufactured by Hitachi Chemical Co. Ltd. of Japan, PCL-FRP-370 106 (78% RC) prepregs manufactured by Polyclad Laminates of Franklin, N.H., GI30, 1080 prepreg manufactured by Isola Laminates of Chandler, Ariz., Epoxy 106 prepreg manufactured by Taconic of Petersburgh, N.Y., Epoxy 106 prepreg manufactured by Nanya Technology Corporation of Taiwan. In one embodiment, 2 ply of 106 prepreg is used on either side of each constraining core. In other embodiments more than 2 ply of 106 prepreg can be used on each side of the constraining core if constraining core thickness is greater than 0.012".

In other embodiment, Resin coated copper (RCC) foil can also be used on either side of the constraining core to fill clearance pattern.

In a number of embodiments, constraining core thickness can be up to 0.012". In many embodiments, the constraining core thickness is limited to 0.010" and in several embodiments the thickness is limited to 0.080".

As discussed above with respect to the manufacturing process shown in FIG. 11, a lamination cycle is performed on the stack up 270. The nature of the lamination cycle is dependent upon the nature of the prepregs and dielectric layers used in the stack up 270. Manufacturers of resins and prepregs specify the temperature and pressure conditions than are recommended during lamination. The lamination cycle can be performed by adhering to the manufacturer's recommendations for the various materials used in the construction of the PWB.

Figure 13B:
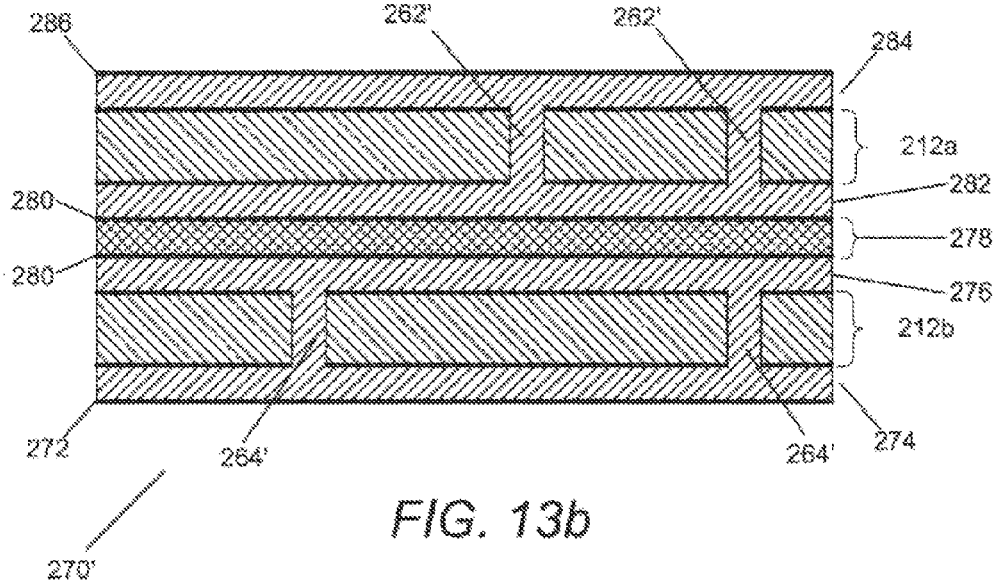

The lamination cycle produces the printed wiring board subassembly 270' in accordance with an embodiment of the present invention shown in FIG. 13b. As a result of the lamination cycle, dielectric resin reflowed from the dielectric prepregs 274 and 276 and filled the pattern of clearance holes 264' in the constraining core 212b. Similarly, dielectric resin reflowed from the dielectric prepregs 282 and 284 and filled clearance holes 262' in the constraining core 212a. The various repreg layers also bonds the layers of the stack up 270' together.

Figure 14:
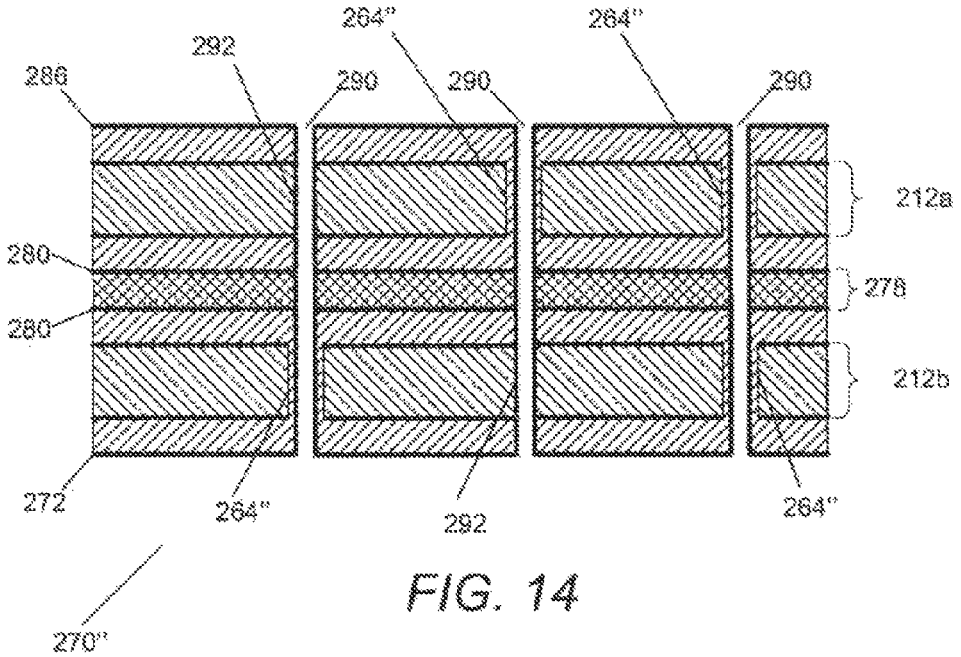
FIG. 14 is a schematic cross-sectional view of a PWB including two electrically conductive constraining cores that act as electrical layers in accordance with an embodiment of the invention.
Figure 15:
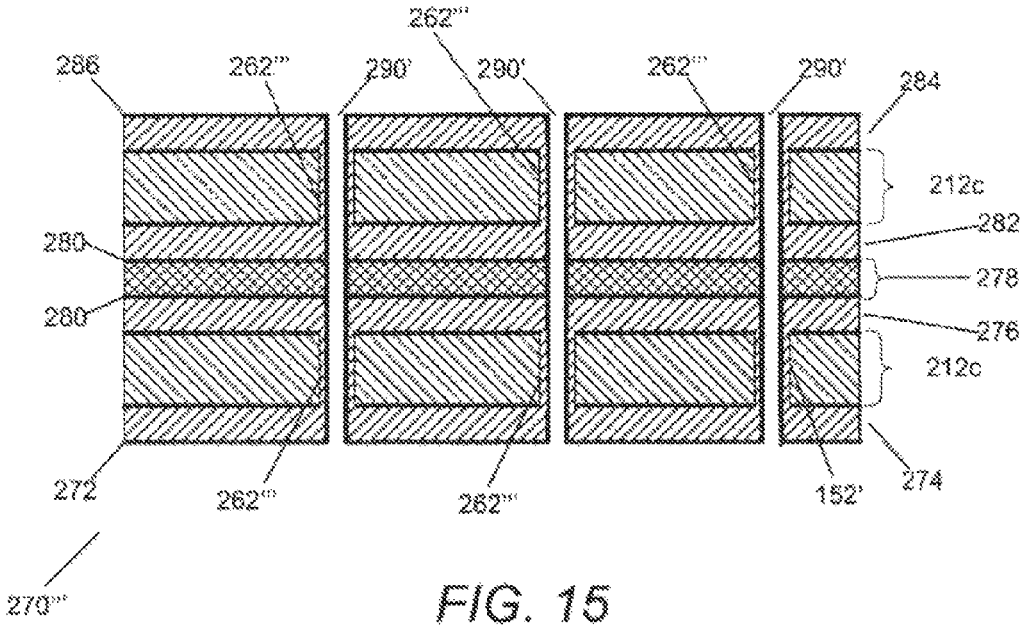
FIG. 15 is a schematic cross-sectional view showing a PWB including two electrically conductive constraining cores that act as physical and not electrical layers in accordance with an embodiment of the invention.

A printed wiring board subassembly through which PTHs have been drilled is shown in FIG. 14. The printed wiring board subassembly 270" includes PTHs 290 that extend through each of the layers of the printed wiring board subassembly. The constraining cores 212a and 212b are functional layers. In several locations where the PTHs intersect the constraining cores, the resin filled clearance holes 262" electrically isolate the constraining core and the plated lining of the through hole. In a number of locations where the PTHs intersect the constraining cores, the plated lining of the through hole directly contacts the material of the constraining core. At these locations 292, electrical connections exist between the PTHs and the constraining cores. A similar printed wiring board subassembly is shown in FIG. 15. The printed wiring board subassembly 270" includes two constraining cores 34 that act as non-functional or structural layers only. Each of the PTHs in the printed wiring board subassembly 270''' are electrically isolated from the constraining cores by resin filled clearance holes 262'''.

Materials such as thick copper core, thick metal core, copper-invar-copper (CIC), copper-molybdenum-copper (CMC) are used in PWBs to address thermal and co-efficient of thermal expansion (CTE) control issues. A thick metal is typically difficult to process and requires special processes to manufacture. A clearance pattern can be manufactured using a special etching chemical. Alternatively, a drilling process similar to the process described above can also be used to pattern clearance holes. Thick metal layers typically cannot, however, be stacked during clearance hole drilling. The ability to stack constraining cores during clearance hole drilling can increase manufacturing throughput as multiple cores can be drilled simultaneously. Another issue that can arise when using thick metal cores is that there is a limitation on the size of the PTH that can be drilled through metal core PWB, because smaller drill bits tend to deflect and/or break when drilling into a thick metal layer.

Figure 16:
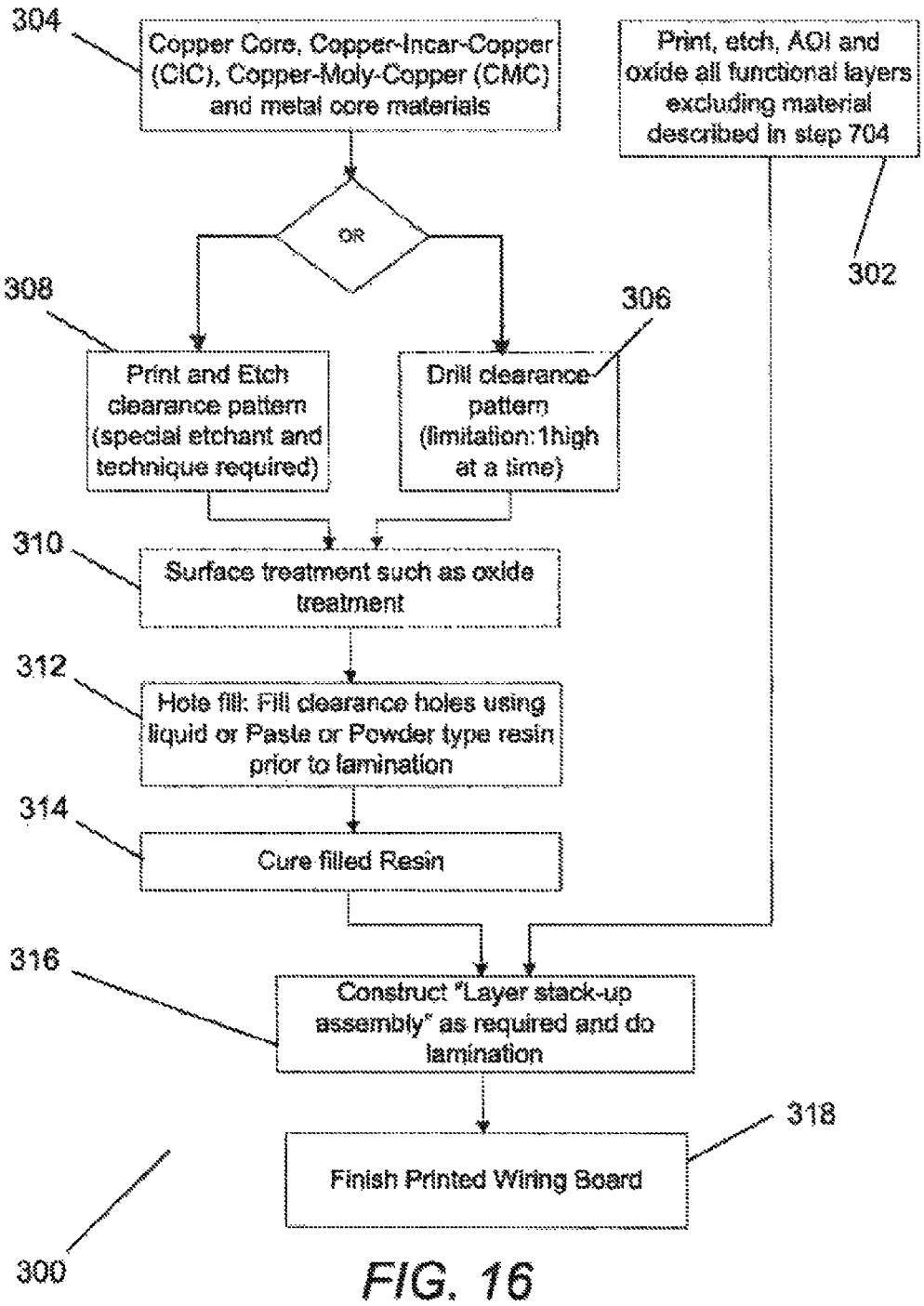
FIG. 16 is a flow chart illustrating a process for manufacturing a metal core printed wiring board in accordance with an embodiment of the invention.

A method of constructing PWBs with metal cores is illustrated in FIG. 16. A process 300 describes process for manufacturing a PWB that includes metal cores, such as CIC, CMC, and/or thick copper. The metal cores are prepared (304). The internal layers of the PWB are also prepared (302). Typically, preparation includes patterning circuits on the internal metal layers. Clearance holes can be patterned onto the metal core (306) using any of the drilling methods described above. A clearance hole pattern can also be created (308) in the metal cores using metal etching chemistry. In many instances, a special surface treatment is desirable to apply (310) to the metal layers to facilitate bonding with the other layers in the PWB. Unlike the processes described above, the clearance hole pattern is not filled with resin during lamination. Rather the clearance hole pattern is filled with resin prior to lamination. In several embodiments, clearance holes are filled (312) with resin including an appropriate filler material using a screening method. The resin used to fill the clearance holes can be in a liquid form, can be in a paste form or it can be in a powder form. The metal layers are then baked or pressed (314) at a temperature recommended by resin manufacturer to cure or semi-cure the resin. The filled metal core layers are then arranged (316) with the internal layers to form a stack up and a lamination process is performed. A variety of processes are then performed (318) to complete the PWB. Although the above process includes a single lamination cycle, in other embodiments a patterned metal constraining core can be combined with B-stage dielectric prepregs and materials used to construct other layers of a PWB in a first lamination cycle and the PWB completed in subsequent lamination cycles.

These limitations of separate hole filling and restrictions on use of smaller plated through holes that are associated with use of thick metal constraining cores can be overcome by replacing metal cores with other types of constraining core materials.

Figure 17:
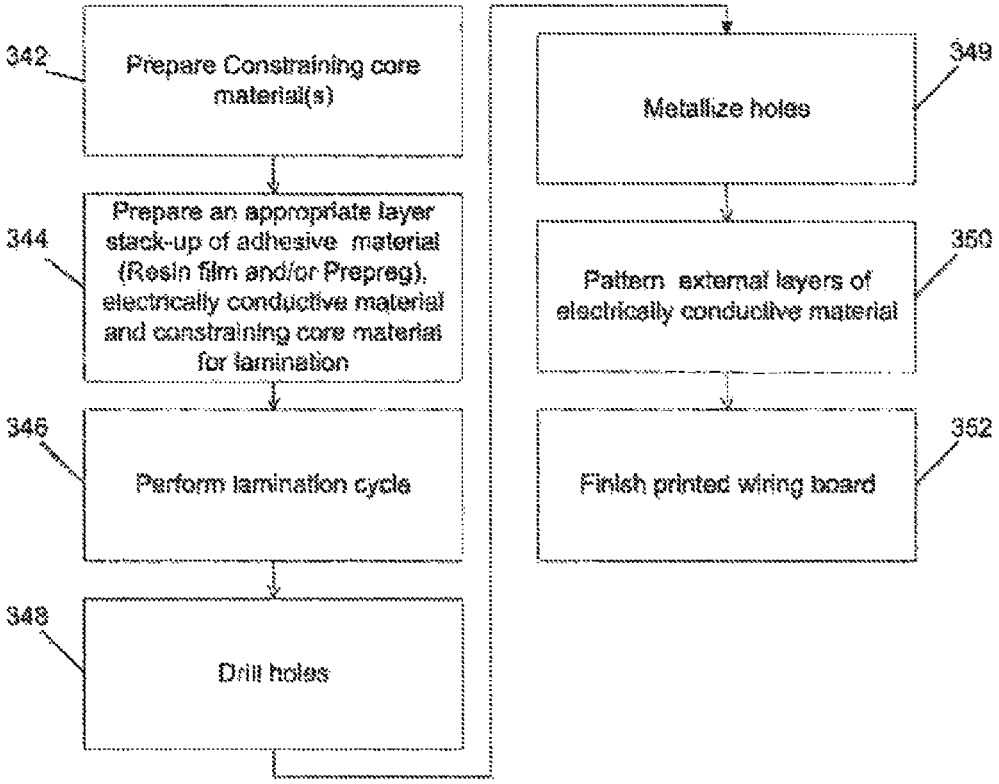
FIG. 17 is a flow chart illustrating a process for manufacturing a printed wiring board with electrically conductive constraining cores in accordance with another embodiment of the invention.

A method of constructing PWBs that include conductive constraining cores that utilize different materials having different physical properties throughout different regions in the constraining core in accordance with an embodiment of the invention is illustrated in FIG. 17. The method 340 involves preparing (342) a constraining core material. As part of the preparation of the constraining core materials, sections of the constraining core materials are removed. The prepared constraining core materials are then arranged (344) with dielectric layers and layers of electrically conductive material in preparation for lamination. The dielectric layers and layers of electrically conductive material can take the form of clad or unclad prepregs and laminates. A lamination cycle is then performed (346) to create a printed wiring board subassembly. Holes can be drilled (348) in portions of the printed wiring board subassembly and the linings of the holes plated (349) with electrically and/or thermally conductive material. The plated printed wiring board subassembly is printed and etched (350) to form a completed PWB. The PWB is then finished (352) and components can be mounted on the PWB. Although the above process includes a single lamination cycle, in other embodiments the patterned base and insert materials can be combined with B-stage dielectric prepregs and materials used to construct other layers of a PWB in a first lamination cycle and the PWB completed in subsequent lamination cycles.

Materials and printed wiring board subassemblies that are utilized during the manufacturing process shown in FIG. 17 in accordance with an embodiment of the present invention are illustrated in FIGS. 18a-18h. As described above, the process for manufacturing PWBs shown in FIG. 17 includes preparing a constraining core material 360. This material is similar to the layer 212 shown in FIG. 9.

In the illustrated embodiment, the constraining core material 360 is non-dielectric and clad on both sides with layers of electrically conductive material such as capper. In other embodiments, the constraining core material 360 can be clad on one side or unclad. In embodiments where the constraining core material is non-dielectric, the predrilling of the constraining core material prior to lamination is typically necessary.

The constraining core material can be prepared by drilling clearance holes 364 and clearance channels 366. The clearance channel can be produced by drilling several holes very close to each other or by using a router. The drilled clearance holes and channels are ultimately filled with resin and can electrically isolate the non-dielectric constraining core material from PTHs drilled through the PWB.

As part of the manufacturing process, the prepared constraining core materials are arranged (344) with dielectric layers 370 and layers of electrically conductive material 372 in preparation for the lamination cycle. This process can be understood with reference to FIGS. 18c-18e. The materials are arranged by initially taking a laminate 374 clad on both sides with electrically conductive material 372 and stacking a first prepreg 376 on top of the clad laminate. Typically, the electrically conductive layer adjacent the prepreg is etched with circuit patterns. In the illustrated embodiment, the clad laminate 374 and the first prepreg 376 are manufactured using any of the well known manufacturing techniques employed by those of ordinary skill in the art.

Figure 18A:
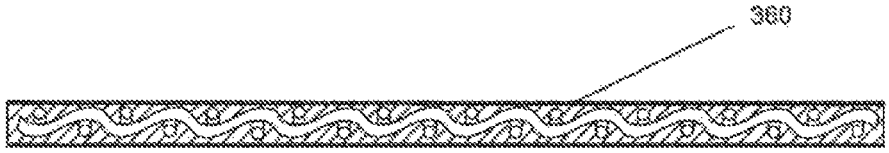
FIGS. 18a-18h are schematic cross-sectional views of various printed wiring board subassemblies that are constructed as part of the manufacturing process illustrated in FIG. 17.
Figure 18B:
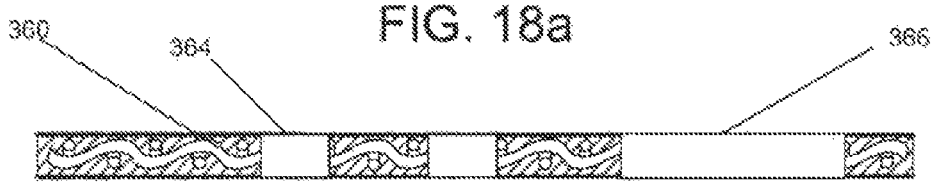
Figure 18C:
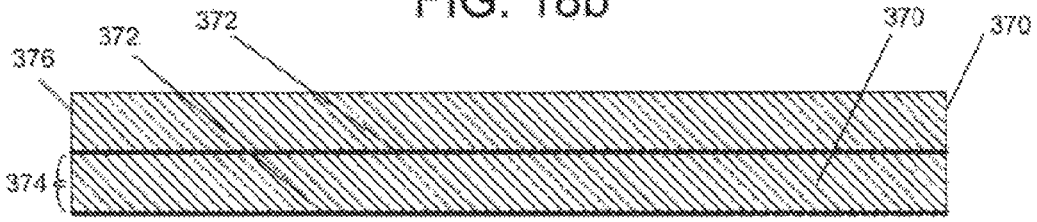
Figure 18D:
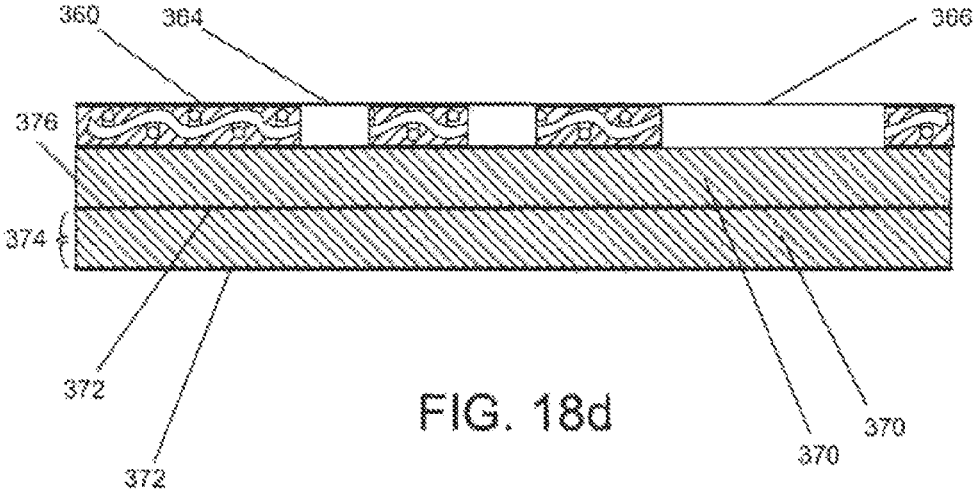
Figure 18E:
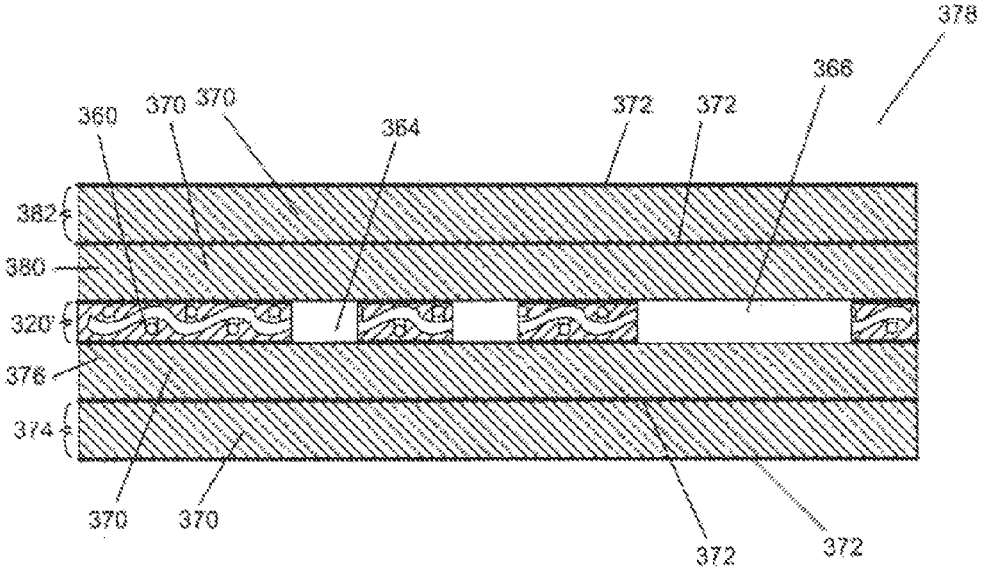

The constraining core material 360 is then placed on top of the first prepreg 376. As discussed above, the constraining core material can be prepared by drilling clearance holes 364 and clearance channels 366. The arrangement 378 is completed by placing a second prepreg layer 380 on top of the layer formed by the constraining core material 360. A laminate clad on both sides with layers of electrically conductive material 382 is then placed on top of the second prepreg. The electrically conductive layer 372 adjacent the second prepreg can be pre-etched with circuit patterns. The resulting arrangement is illustrated in FIG. 18e. Although the illustrated embodiments include a prepreg and a laminate above and below the constraining core material 360, other embodiments can include more than one patterned clad laminate and/or prepreg on either side of the constraining core material 360 in order to form multiple functional layers. Indeed, a PWB in accordance with the present invention can be constructed using two prepregs, each clad on one side that are positioned above and below the layer formed by the constraining core. Furthermore, many embodiments include multiple layers formed by combining a constraining core material with at least one dielectric material.

A lamination cycle is then performed (346). The nature of the lamination cycle is dependent upon the nature of the prepregs and dielectric layers used in the arrangement 378. Manufacturers of resins, prepregs and laminates specify the temperature and pressure conditions that are recommended during lamination. The lamination cycle can be performed by adhering to the manufacturer's recommendations for the various materials used in the construction of the PWB.

Figure 18F:
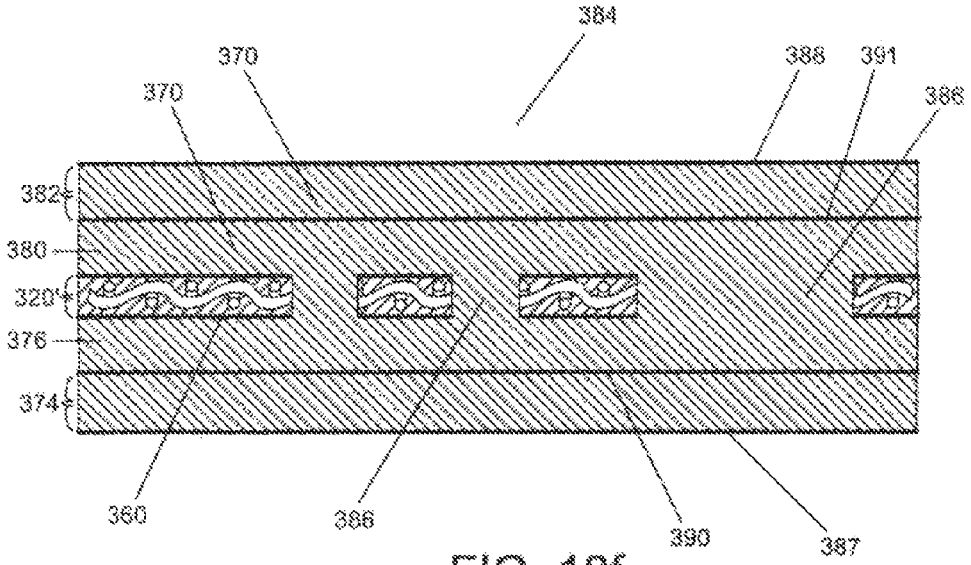

The lamination cycle produces the printed wiring board subassembly 384 in accordance with an embodiment of the present invention shown in FIG. 18f. As a result of the lamination cycle, resin 386 fills the clearance channel gaps and bonds layers together. The resin 386 also fills the clearance holes 364 and bonds the layers of electrically conductive material 390 and 391 to the layer 320' formed by the constraining core 360.

Figure 18G:
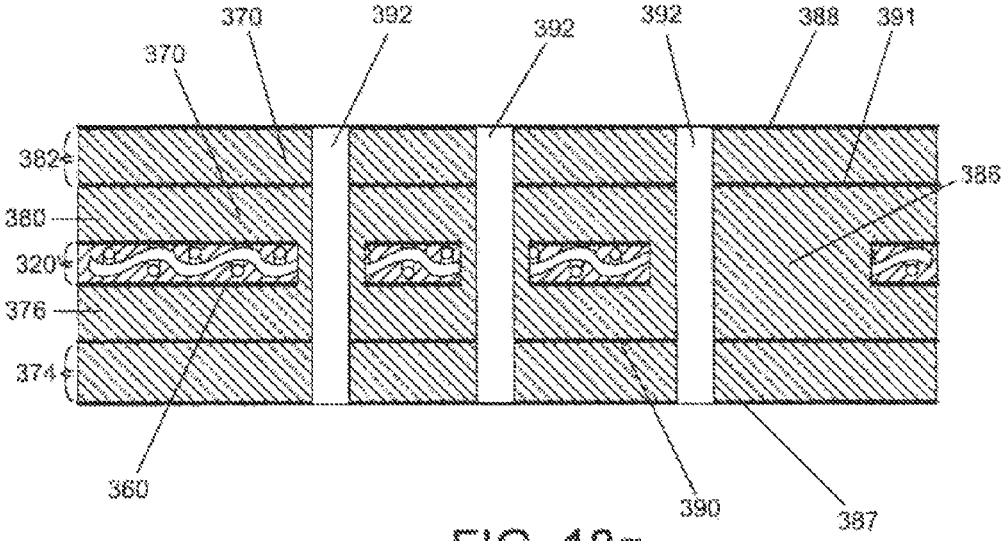
Figure 18H:
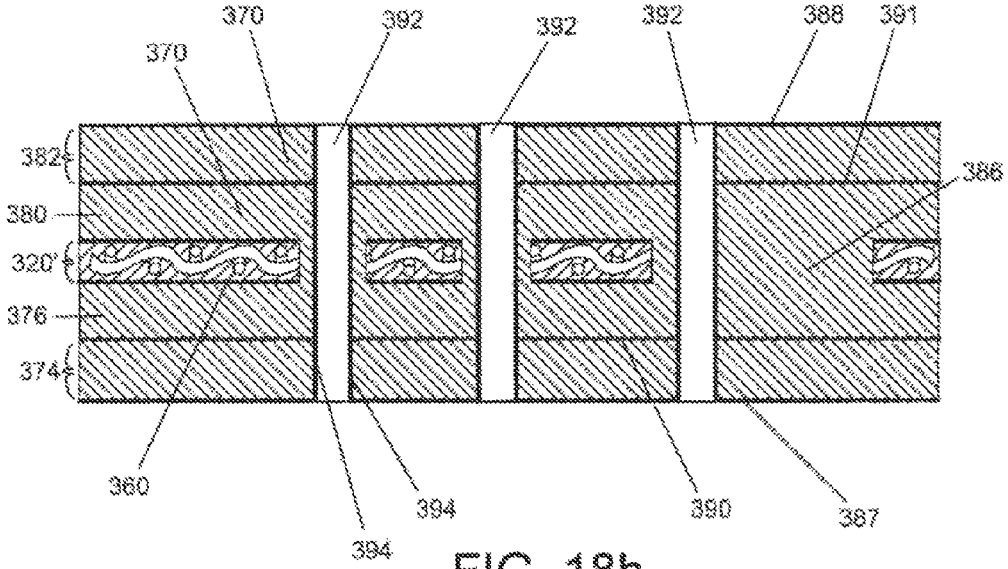

Through holes are drilled (48) in the printed wiring board subassembly. A drilled printed wiring board subassembly in accordance with an embodiment of the invention is shown in FIG. 18g. The printed wiring board subassembly includes a number of holes 392 that extend through each of the layers of the printed wiring board subassembly.

Once the holes have been drilled, the holes are plated (349) and the layers of electrically conductive material are printed and etched (350). These processes create circuits on and between the layers of the PWB. As discussed above, the functional layers can include layers of electrically conductive material and regions of the layer 320'. The circuits created between the functional layers can be used to carry electrical signals. A completed PWB (i.e., a PWB to which electronic devices are connected or mounted) can then be formed.

The process described above can also be used to manufacture PWBs that include buried vias, blind vias and/or microvias. Similar process steps can be used to manufacture integrated circuit substrates (IC substrates or package substrates) having at least one constraining core.

Figure 19:
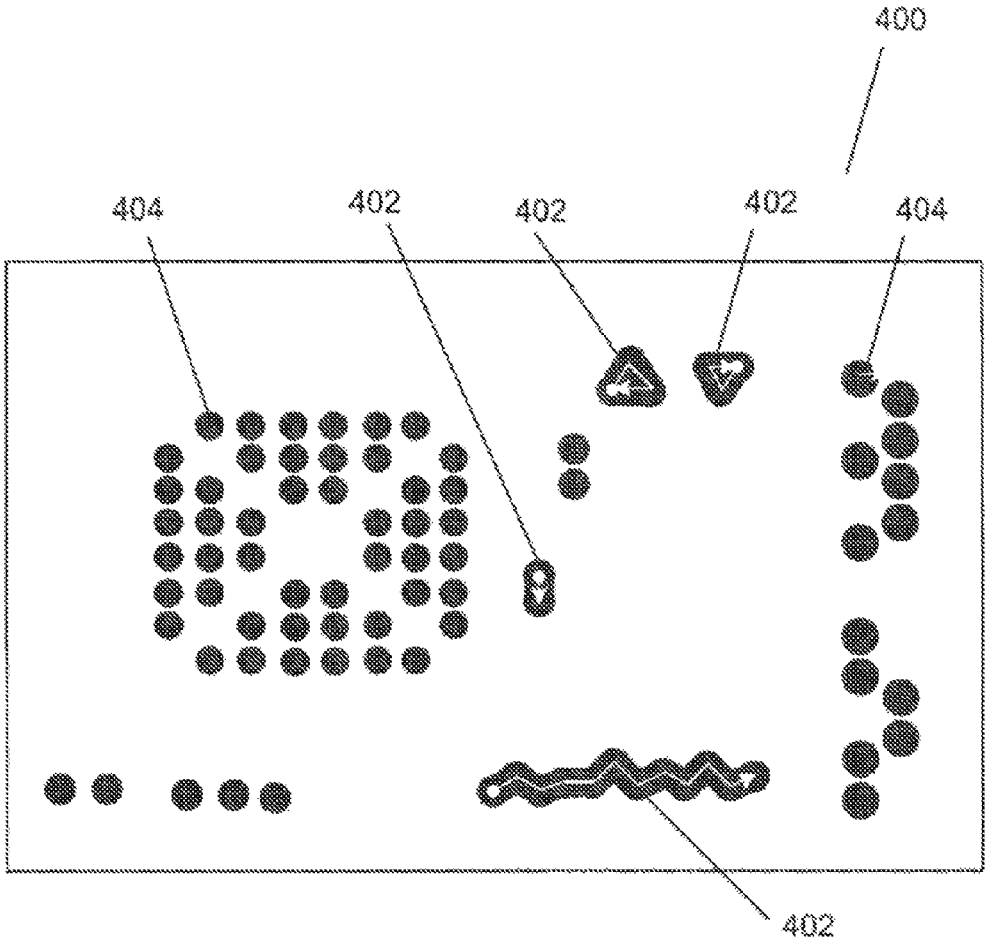
FIG. 19 is a schematic top view of a constraining core in which a pattern of clearance holes and slots have been drilled in accordance with an embodiment of the invention.

Many of the processes outlined above include forming slots in a constraining core. Referring now to FIGS. 19-21 techniques for creating slots using a drill that involve efficient use of the drill are illustrated.

A top view of a constraining core drilled with a pattern of clearance holes and slots (or clearance channels) in accordance with an embodiment of the invention is shown in FIG. 19. The constraining core 400 includes clearance holes 404 and clearance channels 402. Clearance channels are produced because either clearance holes are too close to each other or clearance holes are overlapping on each other. Clearance channels on a constraining core layer can be located either where a plurality of PTHs pass through the constraining core in close proximity or where cross-sectional exposure of the constraining core is not desired after finishing printed wiring board (i.e., locations such as edges of the printed wiring board or sectional walls of a cut-out region that are inside the area of the finished PWB). Generally clearance channels can be formed in a constraining core by mechanical drilling, laser drilling, CNC routing, punching, laser cutting, water jet cutting process or combinations of these processes. Clearance channels located inside the PWB area where a plurality of plated through holes are in close proximity can be formed with mechanical drilling, laser drilling or laser cutting process as these processes are more precise and accurate than CNC routing, punching and water jet cutting process. Where high levels of accuracy are required, mechanical drilling and laser drilling process are preferred.

Figure 20A:
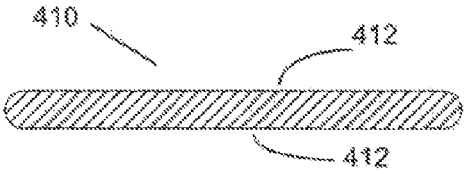
FIGS. 20a-20d are schematic views of slots drilled using holes spaced at different distances in accordance with an embodiment of the invention.

A clearance channel differs from a plated through channel in that a clearance channel is drilled to electrically isolate one material from the constraining core. Clearance channels are typically considerably wider than a PTH. A plated through channel is a channel that creates an electrical connection, typically between the PWB and a lead of an electrical component. A plated through channel in accordance with an embodiment of the invention is shown in FIG. 20a. The channel 410 includes a wall profile 412 that is very smooth. In embodiments where the channel is used to contain a component lead, such walls can facilitate lead insertion. A smooth wall profile 412 can be formed by drilling a plurality of holes at a very fine pitch such as 1 to 3 mil pitch (preferably 1 mil (0.001 inch) pitch). At 1 mil pitch, 1000 holes form a 1.0 inch long plated through channel.

Figure 20B:
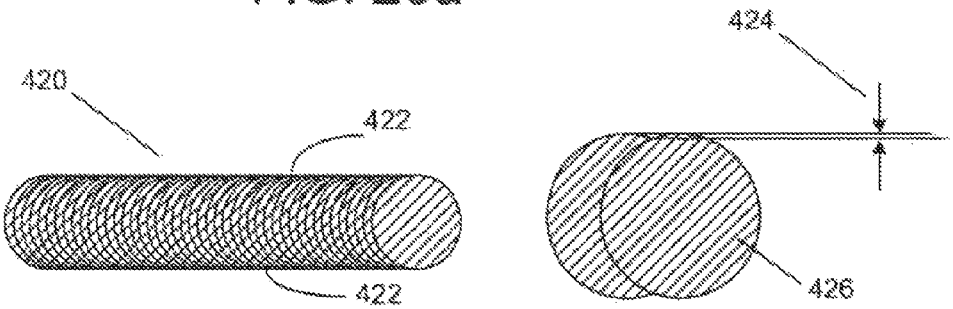

As indicated above, clearance channels are typically wider than plated through channels and are created using bigger diameter tools. A clearance channel is shown in FIG. 20b. The clearance channel 420 has smooth surfaces 422 similar to those of the plated through channel. The plurality of holes 426 that are drilled to produce the clearance channel 420 have a very fine pitch. As can be seen in FIG. 20b, the walls of the clearance channel are not entirely smooth. Ripples exist that are associated with the repetitive drilling process. The notch height 424 (i.e., the extent to which the material of the wall extends into the channel, see FIG. 21b) is very small, less than 0.5 mil. Such a smooth clearance channel wall profile requires many holes to accomplish.

Figure 20C:
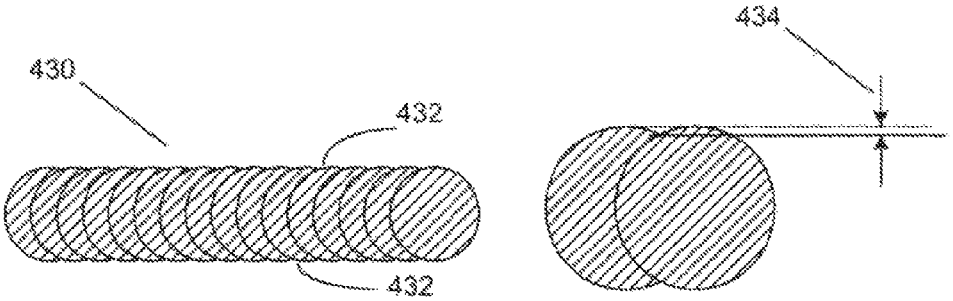
Figure 20D:
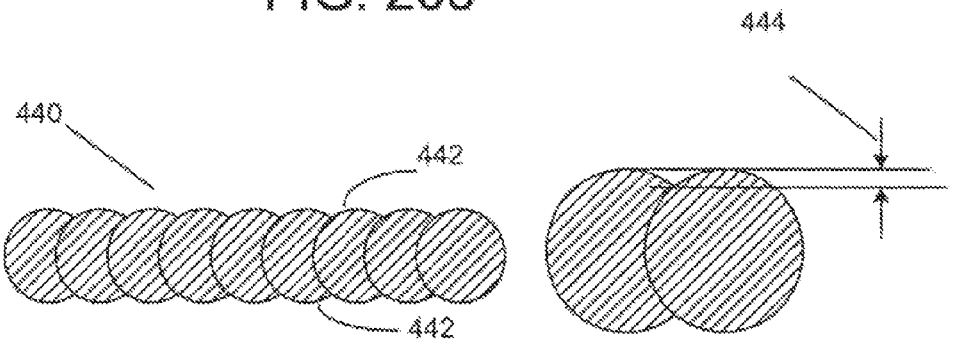

When creating clearance channels in a constraining core, smooth walls are not always required. As seen in FIG. 20c and 20d, a coarser pitch can be used to form a clearance channel (see clearance channels 430 and 440 in FIG. 20c and FIG. 20d). The clearance channels shown have wall profiles 432 and 442 that are not as smooth as wall profile 422. Coarser pitch will increase notch height 434 and 444. In many embodiments, a coarser pitch can be used to drill a channel with width equal to the distance between the notches. In this way, a channel having a rough finish can be created that does not have any notches that intrude within the required width of the channel. Reducing the number of holes required to form a channel can substantially increase throughput when drilling clearance hole and channel patterns in constraining cores.

In a number of embodiments, the length of the notch is limited by the risk of the notch breaking off during lamination and creating the potential for short circuits between a PTH and the constraining core. Preferably notch height in the clearance channel on a constraining core is less than 3 mils. More preferably notch height in the clearance channel is less than or equal to 1 mil.

Figures 21A, 21B:
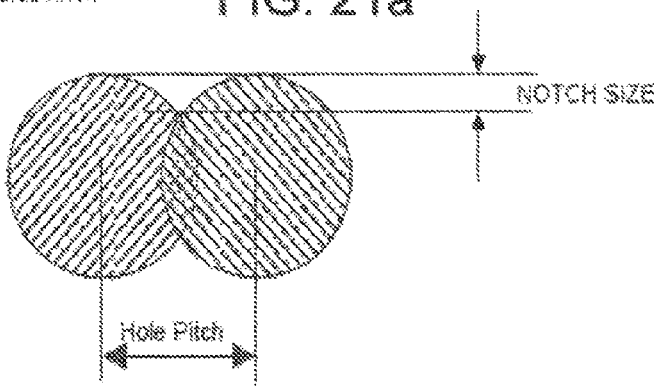
FIG. 21a is a table showing the size of a notch created when two holes are drilled a specified distance apart with a drill bit having a specified diameter.
FIG. 21b is a schematic view of a pair of holes drilled in a constraining core in accordance with an embodiment of the invention.

A table that relates notch size to clearance hole pitch and drill diameter is shown in FIG. 21a. For example if hole size is 28 mil, hole pitch can be increase to 10 mil and still notch size will be well under 1.0 mil. The example demonstrates a reduction in the number of holes by $1/10^{th}$ of the number required to achieve a wall smoothness comparable to that of a plated through channel.

Although the foregoing embodiments are disclosed as typical, it would be understood that additional variations, substitutions and modifications can be made to the system, as disclosed, without departing from the scope of the invention. For example, multiple layers similar to the constraining core 20 shown in FIG. 2 or 139 in FIG. 7 can be included in a single PWB. Also combinations of base materials and insert materials can be used either as functional layers or as non-functional layers. In embodiments where the base materials and insert materials are used to form a functional layer, the functional layer can be used as a ground layer, a power layer or a split plane layer. In addition, any variety of dielectric and electrically conductive materials can be used as either the base material or as an insert material. Furthermore, the cut outs and inserts can be arbitrary shapes and multiple inserts can be located within a single cut out region of a base material. Accordingly, the scope of the invention should be determined not by the embodiments illustrated, but by the appended claims and their equivalents.

What is claimed is:

1. A method of constructing a printed wiring board including an electrically conductive constraining core, *where the electrically conductive constraining core comprises a base material and an insert material,* where the electrically conductive constraining core is a functional layer of the printed wiring board, and where the printed wiring board includes at least one additional functional layer using a single lamination cycle, comprising:

*removing at least one section of a base material, and replacing the at least one removed section with at least one insert material, wherein the aggregate of the base*

*material and the at least one insert material defines the structure of the electrically conductive constraining core;* drilling a pattern of clearance holes in [an] *the* electrically conductive constraining core;

arranging the electrically conductive constraining core in a stack up that includes B-stage [[semi-cured]] (*semi-cured*) layers of dielectric material on either side of the constraining core and additional layers of material, where the electrically conductive constraining core, the B-stage [[semi-cured]] (*semi-cured*) layers of dielectric material, and additional layers of material are arranged so that lamination of the stack up forms the functional layers of the finished printed wiring board;

performing a lamination cycle on the stack up that causes the resin in the B-stage [[semi-cured]] (*semi-cured*) layers of dielectric to reflow and fill the pattern of clearance holes in the electrically conductive constraining core before curing; and drilling through holes through the laminated stack up and plating the through holes to create at least one electrical connection between the electrically conductive constraining core and one of the at least one additional functional layers.

2. The method of claim 1, further comprising:

extracting from a printed wiring board design information concerning the locations of plated through holes that are not intended to be in electrical contact with the electrically conductive constraining core; and determining the pattern of clearance holes using the information concerning the locations of plated through holes that are not intended to be in electrical contact with the electrically conductive constraining core.

3. The method of claim 1, wherein the electrically conductive constraining core has two major surfaces and can conduct electricity directly from one major surface to the other.

4. The method of claim 3, wherein the electrically conductive constraining core has a dielectric constant greater than 6 at 1 MHz.

5. The method of claim 3, wherein the electrically conductive constraining core is constructed using fibrous material impregnated with resin.

6. The method of claim 5, wherein the fibrous material is carbon fiber.

7. The method of claim 6, wherein the carbon fiber is metallized.

8. The method of claim 3, wherein the electrically conductive constraining core is constructed from a thick metal layer.

9. The method of claim 8, further comprising screening resin into the pattern of clearance holes in the electrically conductive constraining core prior to lamination.

10. The method of claim 1, further comprising:

stacking a plurality of electrically conductive constraining cores;

drilling the pattern of clearance holes in the stack of electrically conductive constraining cores; and creating lamination tooling holes in the electrically conductive constraining core.

11. The method of claim 10, further comprising printing and etching the electrically conductive constraining cores to remove debris prior to lamination.

12. The method of claim 1, wherein:

the B-stage [[semi-cured]] (*semi-cured*) layers of dielectric are prepregs; and the stack up includes layers of electrically conductive material.

13. The method of claim 1, wherein the B-stage [[semi-cured]] (*semi-cured*) layers of dielectric include at least 70% by volume resin content.

[14. The method of claim 1 wherein regions of the electrically conductive constraining core are constructed using a base substrate material and at least one region of the electrically conductive constraining core is constructed using an insert substrate material.]

[15. The method of claim 14, further comprising:

selecting a base substrate material;

removing a section of the base substrate material;

selecting an insert substrate material;

cutting a piece of the insert substrate material that can be contained within the removed section of the base substrate material; and arranging the base substrate material and the piece of the insert substrate material as part of the stack up.]

16. The method of claim 1, wherein drilling a pattern of clearance holes further comprises:

determining the location and required width of a clearance channel from a printed wiring board design;

determining the distance between notches that are likely to be created when a selected drill bit and drill pitch are used to drill the channel; and selecting a drill bit and drilling pitch so that the distance between the notches closest to a plated through hole is not less than a predetermined clearance diameter.

17. The method of claim 16, further comprising:

identifying a plated through hole that creates an electrical connection with the electrically conductive constraining core, which is closest to the clearance channel using the printed wiring board design;

determining the distance between the clearance channel and the identified plated through hole;

selecting the drill bit and drilling pitch so that the resulting channel does not overlap the location of the identified plated through hole.

18. The method of claim 16, further comprising:

determining the height of the notches; and selecting a drill bit and drilling pitch so that the height of the notches is less than 3 mil.

19. The method of claim 18, further comprising selecting a drill bit and drilling pitch so that the height of the notches is less than 1 mil.

*20. A method of constructing a printed wiring board that includes at least one constraining core, the constraining core comprising a base material and an insert material, and at least one functional layer, using a single lamination cycle, comprising:*

*removing at least one section of a base material, and replacing the at least one removed section with at least one insert material, wherein the aggregate of the base material and the at least one insert material defines the structure of the constraining core;*

*arranging the constraining core, comprising a base material and at least one insert material, in a stack up that includes B-stage (semi-cured) layers of dielectric material on either side of a respective constraining core and at least one functional layer of material; and*

*performing a lamination cycle on the stack up that causes the resin in the B-stage (semi-cured) layers of dielectric to reflow and bind adjacent layers within the stack up.*

*21. The method of claim 20, wherein at least one of the insert materials includes carbon.*

*22. The method of claim 20, wherein at least one of the insert materials is a carbon plate.*

*23. The method of claim 20, wherein at least one of the insert materials includes carbon fibers.*

*24. The method of claim 20, further comprising drilling a pattern of clearance holes in the at least one constraining core.*

*25. The method of claim 24, further comprising screening resin into the pattern of clearance holes in the at least one constraining core prior to lamination.*

*26. The method of claim 24, wherein drilling a pattern of clearance holes further comprises:*

*determining the location and required width of a clearance channel from a printed wiring board design;*

*determining the distance between notches that are likely to be created when a selected drill bit and drill pitch are used to drill the channel; and*

*selecting a drill bit and drilling pitch so that the distance between the notches closest to a plated hole is not less than a predetermined clearance diameter.*

*27. The method of claim 24, further comprising drilling through holes through the laminated stack up and plating the through holes to create at least one electrical connection between layers within the laminated stack up.*

*28. The method of claim 20, further comprising:*

*stacking a plurality of constraining cores;*

*drilling a pattern of clearance holes in the stack of constraining cores; and*

*creating lamination tooling holes in at least one constraining core.*

*29. The method of claim 20, wherein the B-stage (semi-cured) layers of dielectric are prepregs.*

*30. The method of claim 20, wherein the B-stage (semi-cured) layers of dielectric include at least 70% by volume resin content.*

*31. A method of constructing a printed wiring board including an electrically conductive constraining core, where the electrically conductive constraining core comprises a base material and an insert material, where the electrically conductive constraining core is a functional layer of the printed wiring board, and where the printed wiring board includes at least one additional functional layer, using a single lamination cycle, comprising:*

*removing at least one section of a base material, and replacing the at least one removed section with at least one insert material, wherein the aggregate of the base material and the at least one insert material defines the structure of the electrically conductive constraining core;*

*arranging the electrically conductive constraining core in a stack up that includes B-stage (semi-cured) layers of dielectric material on either side of the electrically conductive constraining core and additional layers of material, where the electrically conductive constraining core, the B-stage (semi-cured) layers of dielectric material, and additional layers of material are arranged so that lamination of the stack up forms the functional layers of the finished printed wiring board;*

*performing a lamination cycle on the stack up that causes the resin in the B-stage (semi-cured) layers of dielectric to reflow and bind adjacent layers within the stack up; and*

*drilling through holes through the laminated stack up and plating the through holes to create at least one electrical connection between the electrically conductive constraining core and at least one additional functional layer.*

*32. The method of claim 31, wherein the electrically conductive constraining core has two major surfaces and can conduct electricity directly from one major surface to the other.*

*33. The method of claim 32, wherein the electrically conductive constraining core has a dielectric constant greater than 6 at 1 MHz.*

*34. The method of claim 32, wherein the electrically conductive constraining core is constructed using fibrous material impregnated with resin.*

*35. The method of claim 34, wherein the fibrous material is carbon fiber.*

*36. The method of claim 35, wherein the carbon fiber is metallized.*

*37. The method of claim 32, wherein the electrically conductive constraining core is constructed from a thick metal layer.*

*38. The method of claim 31, wherein the B-stage (semi-cured) layers of dielectric are prepregs.*

*39. The method of claim 31, wherein the B-stage (semi-cured) layers of dielectric include at least 70% by volume resin content.*

*40. The method of claim 31 wherein at least one insert material includes carbon.*

*41. The method of claim 31 wherein at least one insert material is a carbon plate.*

*42. The method of claim 31 wherein at least one insert material includes carbon fibers.*

*43. A method of constructing a printed wiring board including a constraining core, comprising:*

*providing a base substrate material;*

*removing at least one section of the base substrate material;*

*providing an insert material for at least one section of the base substrate material removed, wherein each insert material can be contained within a respective removed section;*

*placing each insert material in a respective removed section to form a constraining core layer;*

*arranging the constraining core layer in a subassembly stack up that includes B-stage (semi-cured) layers of dielectric material on either side of the constraining core layer and at least one additional layer of material;*

*laminating the subassembly stack up;*

*arranging the laminated subassembly in a stack up that includes B-stage (semi-cured) layers of dielectric material on either side of the laminated subassembly and at least one additional layer of material; and*

*performing a lamination cycle on the stack up that causes the resin in the layers of dielectric to reflow and bind adjacent layers within the stack up.*

*44. The method of claim 43, wherein at least one insert material includes carbon.*

*45. The method of claim 43, wherein at least one insert material is a carbon plate.*

*46. The method of claim 43, wherein at least one insert material includes carbon fibers.*

*47. The method of claim 43, wherein the constraining core is electrically conductive.*

*48. The method of claim 47, further comprising drilling a pattern of clearance holes in the laminated subassembly.*

*49. The method of claim 48, further comprising drilling through holes through the laminated stack up and plating the through holes to create at least one electrical connection between the electrically conductive core and at least one additional layer of material.*

*50. The method of claim 49, wherein drilling a pattern of clearance holes further comprises:*

*determining the location and required width of a clearance channel from a printed wiring board design;*

*determining the distance between notches that are likely to be created when a selected drill bit and drill pitch are used to drill the channel; and*

*selecting a drill bit and drilling pitch so that the distance between the notches closest to a plated through hole is not less than a predetermined clearance diameter.*

*51. The method of claim 50, further comprising:*

*identifying a plated through hole that creates an electrical connection with the electrically conductive constraining core, which is closest to the clearance channel, using the printed wiring board design;*

*determining the distance between the clearance channel and the identified plated through hole;*

*selecting the drill bit and drilling pitch so that the resulting channel does not overlap the location of the identified plated through hole.*

*52. The method of claim 51, further comprising:*

*determining the height of the notches; and*

*selecting a drill bit and drilling pitch so that the height of the notches is less than 3 mil.*

*53. The method of claim 52, further comprising selecting a drill bit and drilling pitch so that the height of the notches is less than 1 mil.*

*54. A method of constructing a constraining core for use in a printed wiring board, comprising:*

*providing a base substrate material;*

*removing at least one section of the base substrate material;*

*providing an insert material for at least one section of the base substrate material removed, wherein each insert material can be contained within a respective removed section;*

*placing each insert material in a respective removed section to form a constraining core layer;*

*arranging the constraining core layer in a stack up that includes B-stage (semi-cured) layers of dielectric material on either side of the constraining core layer and at least one additional layer of material; and*

*performing a lamination cycle on the stack up that causes the resin in the B-stage (semi-cured) layers of dielectric to reflow and bind the layers.*

*55. The method of claim 54, wherein at least one insert material is includes carbon.*

*56. The method of claim 54, wherein at least one insert material is a carbon plate.*

*57. The method of claim 54, wherein at least one insert material includes carbon fibers.*

* * * * *